United States Patent
Seon et al.

(10) Patent No.: US 12,207,491 B2
(45) Date of Patent: Jan. 21, 2025

(54) DISPLAY DEVICE INCLUDING SUB-METAL LAYERS AND TIP

(71) Applicant: SAMSUNG DISPLAY CO., LTD., Yongin-si (KR)

(72) Inventors: Jongbaek Seon, Yongin-si (KR); Jaehak Lee, Yongin-si (KR); Juncheol Shin, Yongin-si (KR); Jieun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/850,909

(22) Filed: Jun. 27, 2022

(65) Prior Publication Data

US 2022/0328790 A1    Oct. 13, 2022

Related U.S. Application Data

(63) Continuation of application No. 16/791,162, filed on Feb. 14, 2020, now Pat. No. 11,374,200.

(30) Foreign Application Priority Data

Jun. 21, 2019    (KR) ........................ 10-2019-0074119

(51) Int. Cl.
  *H10K 50/84*    (2023.01)
  *H10K 50/844*    (2023.01)
  (Continued)

(52) U.S. Cl.
  CPC .......... *H10K 50/844* (2023.02); *H10K 59/12* (2023.02); *H10K 77/10* (2023.02);
  (Continued)

(58) Field of Classification Search
  CPC .... H10K 50/844; H10K 50/84; H10K 50/868; H10K 50/8445; H10K 50/8426;
  (Continued)

(56) References Cited

U.S. PATENT DOCUMENTS 8,809,863 B2    8/2014    Kim et al.
8,947,627 B2    2/2015    Rappoport et al.
(Continued)

FOREIGN PATENT DOCUMENTS

JP    2017-182052 A    10/2017
KR    10-2017-0059864 A    5/2017
(Continued)

*Primary Examiner* — Ida M Soward
(74) *Attorney, Agent, or Firm* — Lewis Roca Rothgerber Christie LLP

(57) ABSTRACT

A display device includes: a substrate having an opening; a plurality of display elements at a display area adjacent to the opening, the plurality of display elements each including a pixel electrode, an opposite electrode, and an intermediate layer between the pixel electrode and the opposite electrode; and a metal stacked structure between the opening and the display area, and including: a first sub-metal layer having a first hole; and a second sub-metal layer under the first sub-metal layer and having a second hole, the second hole overlapping with the first hole and having a width greater than a width of the first hole.

19 Claims, 25 Drawing Sheets

(51) Int. Cl.
  *H10K 59/12* (2023.01)
  *H10K 77/10* (2023.01)
  *G02F 1/1333* (2006.01)
  *G02F 1/1335* (2006.01)
  *G02F 1/1362* (2006.01)
  *G09G 3/3266* (2016.01)
  *G09G 3/3275* (2016.01)
  *H01L 27/146* (2006.01)
  *H10K 50/80* (2023.01)
  *H10K 59/00* (2023.01)
  *H10K 59/121* (2023.01)
  *H10K 59/122* (2023.01)
  *H10K 59/123* (2023.01)
  *H10K 59/124* (2023.01)
  *H10K 59/131* (2023.01)
  *H10K 59/40* (2023.01)
  *H10K 102/00* (2023.01)

(52) U.S. Cl.
  CPC .. *G02F 1/133331* (2021.01); *G02F 1/133512* (2013.01); *G02F 1/133514* (2013.01); *G02F 1/133528* (2013.01); *G02F 1/136209* (2013.01); *G09G 3/3266* (2013.01); *G09G 3/3275* (2013.01); *H01L 27/14678* (2013.01); *H10K 50/84* (2023.02); *H10K 50/868* (2023.02); *H10K 59/00* (2023.02); *H10K 59/1213* (2023.02); *H10K 59/122* (2023.02); *H10K 59/123* (2023.02); *H10K 59/124* (2023.02); *H10K 59/131* (2023.02); *H10K 59/40* (2023.02); *H10K 2102/00* (2023.02)

(58) Field of Classification Search
  CPC .... H10K 59/12; H10K 59/00; H10K 59/1213; H10K 59/122; H10K 59/123; H10K 59/124; H10K 59/131; H10K 59/40; H10K 77/10; H10K 2102/00; H01L 27/14678; G02F 1/133331; G02F 1/133512; G02F 1/133514; G02F 1/133528; G02F 1/136209; G09G 3/3266; G09G 3/3275
  See application file for complete search history.

(56) References Cited

U.S. PATENT DOCUMENTS

| | | | |
|---|---|---|---|
| 10,205,122 B2 | 2/2019 | Choi et al. | |
| 10,324,345 B2 | 6/2019 | Chen et al. | |
| 10,332,947 B2 | 6/2019 | Kim et al. | |
| 10,454,067 B2 | 10/2019 | Seo et al. | |
| 10,553,819 B2 | 2/2020 | Kim et al. | |
| 10,748,974 B2 * | 8/2020 | Lee | H01L 27/1248 |
| 10,756,156 B2 | 8/2020 | Sung et al. | |
| 10,797,266 B2 | 10/2020 | Choi et al. | |
| 10,840,478 B2 | 11/2020 | Han et al. | |
| 10,862,068 B2 | 12/2020 | Choi et al. | |
| 10,886,505 B2 | 1/2021 | Han et al. | |
| 10,978,672 B2 | 4/2021 | Lee et al. | |
| 2013/0032802 A1 * | 2/2013 | Kim | H10K 59/121 438/34 |
| 2014/0322836 A1 * | 10/2014 | Kim | H01L 27/1259 438/23 |
| 2017/0069873 A1 * | 3/2017 | Kim | H10K 59/88 |
| 2018/0026226 A1 | 1/2018 | Choi et al. | |
| 2018/0061910 A1 * | 3/2018 | Cai | H10K 59/131 |
| 2018/0151831 A1 | 5/2018 | Lee et al. | |
| 2018/0315806 A1 | 11/2018 | Lee et al. | |
| 2018/0366524 A1 | 12/2018 | Bang et al. | |
| 2019/0051859 A1 | 2/2019 | Choi et al. | |
| 2019/0074479 A1 * | 3/2019 | Lee | H10K 71/00 |
| 2019/0081273 A1 * | 3/2019 | Sung | H10K 50/80 |
| 2019/0157609 A1 | 5/2019 | Suzuki | |
| 2019/0181205 A1 | 6/2019 | Kim | |
| 2019/0245159 A1 * | 8/2019 | Kim | H10K 50/8445 |
| 2019/0265568 A1 | 8/2019 | Chen et al. | |
| 2019/0288047 A1 | 9/2019 | Jeong et al. | |
| 2019/0326549 A1 * | 10/2019 | Kokame | H05B 33/06 |
| 2019/0334120 A1 * | 10/2019 | Seo | H10K 71/00 |
| 2019/0355930 A1 * | 11/2019 | Lee | H10K 59/121 |
| 2020/0006700 A1 * | 1/2020 | Kim | H10K 59/60 |
| 2020/0006701 A1 * | 1/2020 | Lee | H10K 59/87 |
| 2020/0064968 A1 | 2/2020 | Kim et al. | |
| 2020/0106045 A1 * | 4/2020 | Han | H10K 59/65 |
| 2020/0110495 A1 | 4/2020 | Han et al. | |
| 2020/0119131 A1 | 4/2020 | Ohara | |
| 2020/0161582 A1 * | 5/2020 | Choi | H10K 59/121 |
| 2020/0176520 A1 | 6/2020 | Kim et al. | |
| 2020/0176538 A1 | 6/2020 | Um et al. | |
| 2020/0212353 A1 | 7/2020 | Kim et al. | |
| 2020/0286948 A1 | 9/2020 | Qin et al. | |
| 2021/0143370 A1 * | 5/2021 | Choi | H10K 59/80 |
| 2021/0151715 A1 | 5/2021 | Lee et al. | |
| 2021/0210718 A1 | 7/2021 | Zhang et al. | |
| 2021/0234122 A1 | 7/2021 | Choi et al. | |
| 2023/0059042 A1 * | 2/2023 | Lee | H10K 59/12 |

FOREIGN PATENT DOCUMENTS

| | | |
|---|---|---|
| KR | 10-2018-0009845 A | 1/2018 |
| KR | 10-2018-0026599 A | 3/2018 |
| KR | 10-2018-0062284 A | 6/2018 |
| KR | 10-2019-0018120 A | 2/2019 |
| WO | WO 2020/114052 A1 | 6/2020 |

* cited by examiner

DISPLAY DEVICE INCLUDING SUB-METAL LAYERS AND TIP

CROSS-REFERENCE TO RELATED APPLICATIONS

This application is a continuation of U.S. patent application Ser. No. 16/791,162, filed Feb. 14, 2020, which claims priority to and the benefit of Korean Patent Application No. 10-2019-0074119, filed Jun. 21, 2019, the entire content of both of which is incorporated herein by reference.

BACKGROUND

1. Field

One or more embodiments relate to a display device.

2. Description of Related Art

Recently, the purposes of a display device have become more diversified. Also, as display devices have become thinner and more lightweight, their range of use has gradually been extended.

As an area occupied by a display area of a display device increases, functions that may be combined or associated with the display device are being added. As a way for adding various functions while extending an area, research into a display device in which various elements may be arranged in a display area is in progress.

The above information disclosed in this Background section is for enhancement of understanding of the background of the present disclosure, and therefore, it may contain information that does not constitute prior art.

SUMMARY

In a display device including an opening, impurities such as moisture may penetrate into a lateral surface of the opening. In this case, display elements surrounding the opening may be damaged. One or more embodiments relate to a display panel having a structure that may prevent or reduce moisture transmission through an opening, and a display device including the display panel. However, it should be understood that embodiments described herein should be considered in a descriptive sense and not for limitation of the present disclosure.

According to one or more embodiments, a display device includes: a substrate having an opening; a plurality of display elements at a display area adjacent to the opening, the plurality of display elements each including a pixel electrode, an opposite electrode, and an intermediate layer between the pixel electrode and the opposite electrode; and a metal stacked structure between the opening and the display area, and including: a first sub-metal layer having a first hole; and a second sub-metal layer under the first sub-metal layer and having a second hole, the second hole overlapping with the first hole and having a width greater than a width of the first hole.

In some embodiments, an edge of the first sub-metal layer that defines the first hole may include a tip that protrudes further toward a center of the first hole than an edge of the second sub-metal layer that defines the second hole, and the intermediate layer may include at least one organic material layer that is separated by the tip.

In some embodiments, the display device may further include: an inorganic insulating layer under the metal stacked structure, and a separated portion of the at least one organic material layer separated by the tip may be on the inorganic insulating layer.

In some embodiments, the opposite electrode may be separated by the tip.

In some embodiments, the at least one organic material layer may include at least one of a hole transport layer, a hole injection layer, an electron transport layer, or an electron injection layer.

In some embodiments, the first sub-metal layer may include one or more different metals from that of the second sub-metal layer.

In some embodiments, the display device may further include: an organic insulating layer on the first sub-metal layer, and the organic insulating layer may have a hole overlapping with the first hole.

In some embodiments, a width of the hole of the organic insulating layer may be greater than or equal to the width of the first hole.

In some embodiments, the metal stacked structure may further include: a third sub-metal layer under the second sub-metal layer, and the third sub-metal layer may have a third hole overlapping with each of the first hole and the second hole.

In some embodiments, a width of the third hole may be less than or equal to the width of the second hole.

According to one or more embodiments, a display device includes: a substrate having an opening, a display area adjacent to the opening, and a non-display area between the opening and the display area; a plurality of display elements at the display area, the plurality of display elements each including a pixel electrode, an opposite electrode, and an intermediate layer between the pixel electrode and the opposite electrode; a thin-film encapsulation layer on the plurality of display elements, the thin-film encapsulation layer including at least one inorganic encapsulation layer and at least one organic encapsulation layer; and a metal stacked structure on the non-display area, the metal stacked structure including: a first sub-metal layer having a first hole; and a second sub-metal layer under the first sub-metal layer and having a second hole overlapping with the first hole. An edge of the first sub-metal layer that defines the first hole includes a tip that extends further toward a center of the first or second hole than an edge of the second sub-metal layer that defines the second hole. The intermediate layer includes at least one organic material layer, and one or more of the opposite electrode and the at least one organic material layer is separated by the tip.

In some embodiments, the at least one organic material layer may include at least one of a hole transport layer, a hole injection layer, an electron transport layer, or an electron injection layer.

In some embodiments, the first sub-metal layer may include one or more metals that are different from that of the second sub-metal layer.

In some embodiments, the first sub-metal layer may include titanium, and the second sub-metal layer may include aluminum.

In some embodiments, the display device may further include: an insulating layer on the first sub-metal layer, and the insulating layer may have a hole overlapping with the first hole.

In some embodiments, the insulating layer may include an organic insulating layer or an inorganic insulating layer.

In some embodiments, a width of the hole of the insulating layer may be greater than or equal to a width of the first hole.

In some embodiments, the metal stacked structure may further include: a third sub-metal layer under the second sub-metal layer and having a third hole overlapping with each of the first hole and the second hole.

In some embodiments, a width of the third hole may be less than or equal to a width of the second hole.

In some embodiments, the at least one inorganic encapsulation layer may cover inner surfaces of the first hole and the second hole.

BRIEF DESCRIPTION OF THE DRAWINGS

The above and other aspects and features of example embodiments of the present disclosure will become more apparent to those skilled in the art from the following detailed description of the example embodiments with reference to the accompanying drawings, in which.

DETAILED DESCRIPTION

Figure 1:
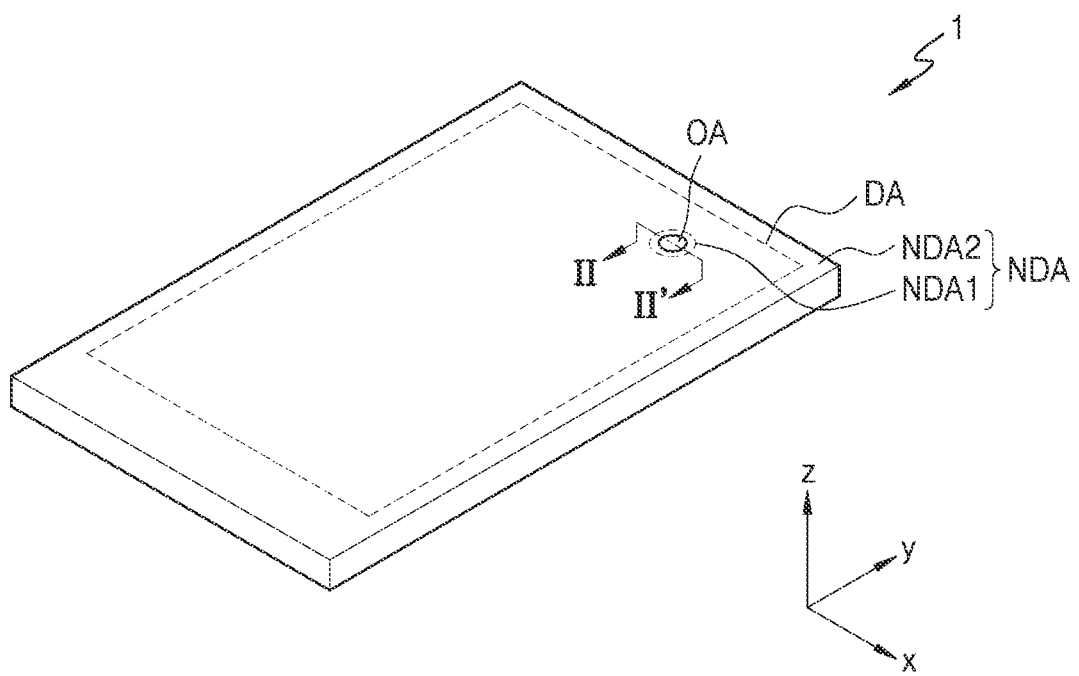
FIG. 1 is a perspective view of a display device according to an embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, "A and/or B" means A or B, or A and B. Expressions such as "at least one of," when preceding a list of elements, modify the entire list of elements and do not modify the individual elements of the list. For example, "at least one of A, B, or C" means A, B, C, A and B, A and C, B and C, or A and B and C.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device 1 according to an embodiment.

Referring to FIG. 1, the display device 1 includes a display area DA that emits (and/or transmits) light and a non-display area NDA that does not emit (and/or transmit) light. The non-display area NDA is adjacent to (or neighbors) the display area DA. The display device 1 may display (or provide) an image (e.g., a predetermined image) by using various light emitted from a plurality of pixels arranged at (e.g., in or on) the display area DA.

The display device 1 includes an opening area OA that is at least partially surrounded by the display area DA. For example, as shown in FIG. 1, in some embodiments, the opening area OA may be entirely surrounded (e.g., around a periphery of the opening area OA) by the display area DA. The non-display area NDA may include a first non-display area NDA1 surrounding (e.g., around a periphery of) the opening area OA, and a second non-display area NDA2 surrounding (e.g., around a periphery of) the display area DA. The first non-display area NDA1 may entirely surround (e.g., around a periphery of) the opening area OA, the display area DA may entirely surround (e.g., around a periphery of) the first non-display area NDA1, and the second non-display area NDA2 may entirely surround (e.g., around a periphery of) the display area DA.

Hereinafter, an example of the display device 1 is provided as an organic light-emitting display device according to an embodiment. However, the display device 1 is not limited to the example of the organic light-emitting display device, and in other embodiments, the display device 1 may be various suitable kinds of display devices, for example, such as an inorganic light-emitting display, a quantum dot light-emitting display, or the like.

Figure 2:
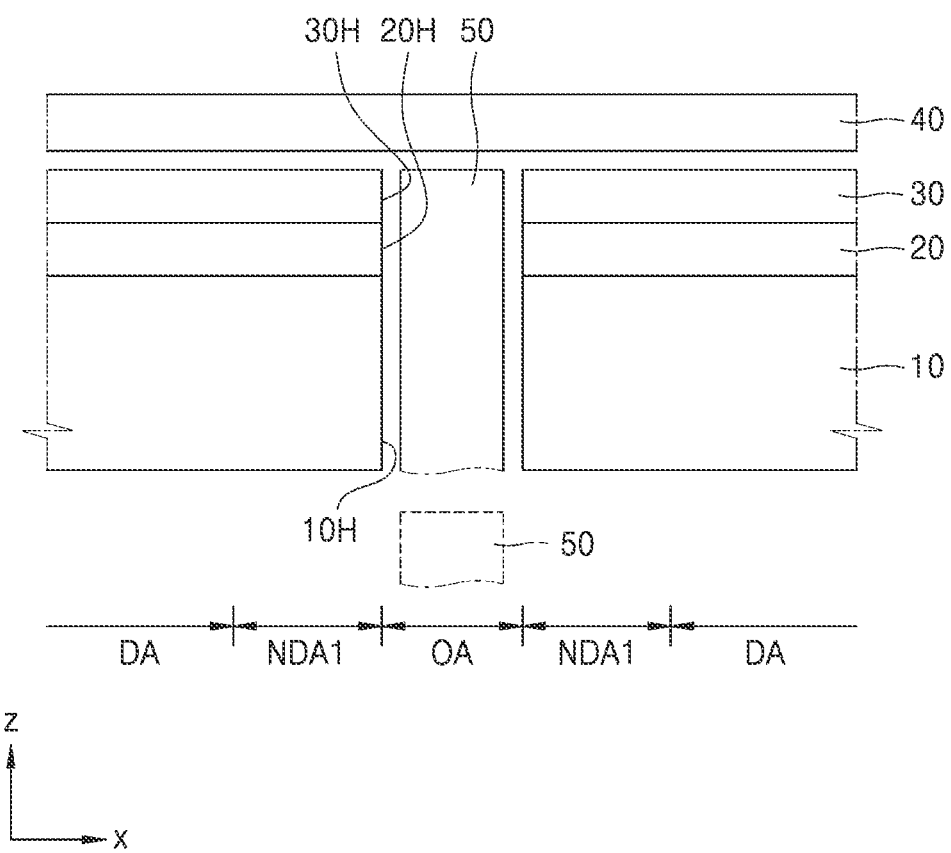
FIG. 2 is a cross-sectional view of a display device according to an embodiment.

FIG. 2 is a cross-sectional view of the display device 1 according to an embodiment. For example, FIG. 2 corresponds to a cross-section of the display device 1 taken along the line II-II' of FIG. 1.

Referring to FIG. 2, the display device 1 may include a display panel 10, an input sensing member (e.g., an input sensor) 20, and an optical functional member (e.g., an optical functional layer) 30 arranged on the display panel 10. In some embodiments, the display panel 10, the input sensing member 20, and the optical functional member 30 may be covered by a window 40. The display device 1 may be included in various kinds of electronic apparatuses, for example, such as mobile phones, notebook computers, smartwatches, or the like.

The display panel 10 may display an image. The display panel 10 includes a plurality of pixels arranged at (e.g., in or on) the display area DA. Each of the pixels may include a display element and a pixel circuit connected to the display element. For example, in various embodiments, the display element may include an organic light-emitting diode, a quantum dot light-emitting diode, or the like.

The input sensing member 20 obtains (e.g., determines or detects) coordinate information corresponding to an external input, for example, a touch event. The input sensing member 20 may include a sensing electrode (or a touch electrode), and trace lines connected to the sensing electrode. The input sensing member 20 may be on the display panel 10.

The input sensing member 20 may be directly formed on the display panel 10, or may be separately formed and then coupled to (e.g., connected to or attached to) the display panel 10 by using an adhesive layer, for example, such as an optically clear adhesive OCA. For example, the input sensing member 20 may be formed (e.g., successively formed) after a process of forming the display panel 10. In this case, an adhesive layer may not be arranged between the input sensing member 20 and the display panel 10. Though it is shown in FIG. 2 that the input sensing member 20 is arranged between the display panel 10 and the optical functional member 30, the input sensing member 20 may be arranged on the optical functional member 30 in another embodiment.

The optical functional member 30 may include a reflection prevention layer. The reflection prevention layer may reduce reflectivity of light (e.g., external light) that is incident toward the display panel 10 from the outside through the window 40. The reflection prevention layer may include a retarder and a polarizer. The retarder may include a film-type retarder or a liquid crystal-type retarder. The retarder may include a $\lambda/2$ retarder (e.g., a half-wave retarder) and/or a $\lambda/4$ retarder (e.g., a quarter-wave retarder). The polarizer may include a film-type polarizer or a liquid crystal-type polarizer. The film-type polarizer may include a stretchable synthetic resin film, and the liquid crystal-type polarizer may include liquid crystals that are arranged in a predetermined arrangement. Each of the retarder and the polarizer may further include a protective film. The retarder and the polarizer themselves, or a protective film may be defined as a base layer of the reflection prevention layer.

In another embodiment, the reflection prevention layer may include a black matrix and color filters. The color filters may be arranged by taking into account the colors of light emitted respectively from the pixels of the display panel 10. In another embodiment, the reflection prevention layer may include a destructive interference structure. The destructive interference structure may include a first reflection layer and a second reflection layer arranged at (e.g., on) different layers. First-reflected light and second-reflected light that are respectively reflected by the first reflection layer and the second reflection layer may create destructive-interference, and thus, the reflectivity of external light may be reduced.

The optical functional member 30 may include a lens layer. The lens layer may improve emission efficiency of light emitted from the display panel 10 and/or reduce color deviation. The lens layer may include a layer having a concave lens shape or convex lens shape, and/or may include a plurality of layers having different refractive indexes. The optical functional member 30 may include both the reflection prevention layer and the lens layer, or may include one of the reflection prevention layer or the lens layer.

The display panel 10, the input sensing member 20, and the optical functional member 30 may each include an opening. For example, as shown in FIG. 2, the display panel 10, the input sensing member 20, and the optical functional member 30 may respectively include a first opening 10H, a second opening 20H, and a third opening 30H. The first opening 10H, the second opening 20H, and the third opening 30H may overlap with one another. The first opening 10H, the second opening 20H, and the third opening 30H are located to correspond to the opening area OA. In another embodiment, at least one of the display panel 10, the input sensing member 20, or the optical functional member 30 may not include an opening. For example, one or two of the display panel 10, the input sensing member 20, and the optical functional member 30 may not include an opening.

A component 50 may correspond to the opening area OA. For example, the component 50 may be located within (e.g., inside) the first to third openings 10H, 20H, and 30H as shown by solid lines in FIG. 2, or may be located below the display panel 10 as shown by dotted lines in FIG. 2.

The component 50 may include an electronic element. For example, the component 50 may include an electronic element that uses light or sound. For example, the electronic element may be a sensor such as an infrared sensor that emits and/or receives light, a camera that receives light and captures an image, a sensor that outputs and senses light or sound to measure a distance or to recognize a fingerprint, a small lamp that outputs light, a speaker that outputs sound, or the like. An electronic element that uses light may use light in various wavelength bands, such as visible light, infrared light, and/or ultraviolet light. In an embodiment, the opening area OA may be a transmission area through which light and/or sound may pass. For example, the light and/or sound may be output from the component 50 to the outside or may propagate toward the electronic element of the component 50 from the outside, such that the light and/or sound transmits through the opening area OA.

In the case where the display device 1 is used as (or included in) a smartwatch or an instrument panel for an automobile, the component 50 may include a member such as clock hands or a needle indicating predetermined information (e.g. the time of day, the velocity of a vehicle, or the like). For example, if the display device 1 is included in a smartwatch or an instrument panel for an automobile, the component 50 (e.g., including the clock hands, needle, or the like) may pass through the window 40 and may be exposed to the outside. In this case, the window 40 may include an opening corresponding to the opening area OA.

The component 50 may include an element(s) related to a function of the display panel 10 as described above, or may include an element(s) such as an accessory that increases aesthetic sense of the display panel 10.

Figure 3:
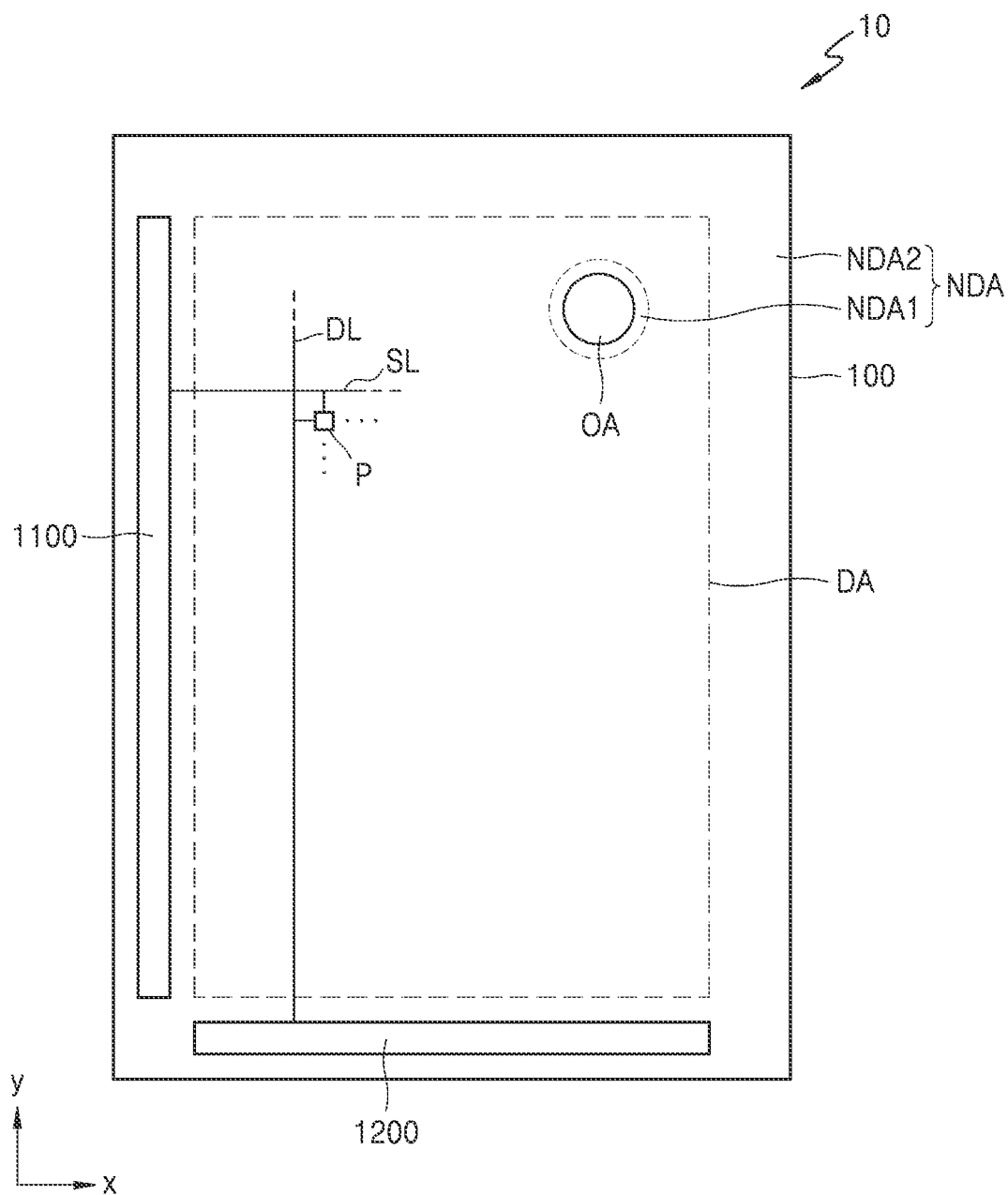
FIG. 3 is a plan view of a display panel according to an embodiment.
Figure 4:
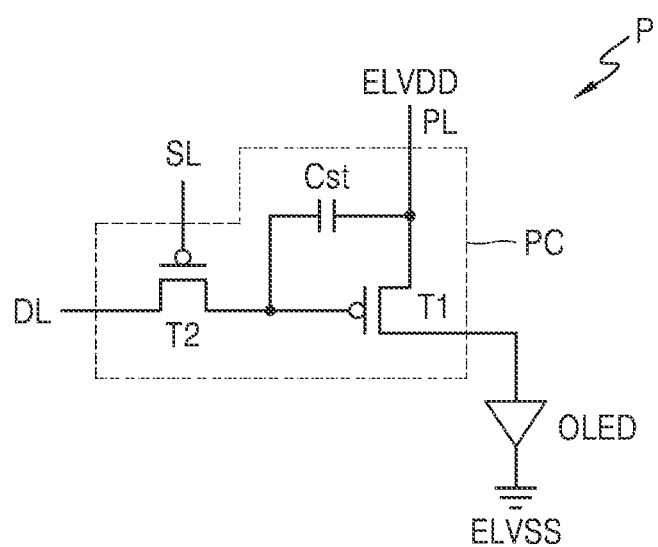
FIG. 4 is an equivalent circuit diagram of a pixel included in the display panel of FIG. 3.

FIG. 3 is a plan view of a display panel according to an embodiment, and FIG. 4 is an equivalent circuit diagram of a pixel included in the display panel of FIG. 3.

Referring to FIG. 3, the display panel 10 includes the display area DA, the first non-display area NDA1, and the second non-display area NDA2. In FIG. 3, a substrate 100 of the display panel 10 is illustrated. For example, the substrate 100 may include the opening area OA, the display area DA, the first non-display area NDA1, and the second non-display area NDA2.

The display panel 10 includes a plurality of pixels P arranged at (e.g., in or on) the display area DA. As shown in FIG. 4, each pixel P includes a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, blue, or white light through the corresponding organic light-emitting diode OLED.

The second thin film transistor T2 may include a switching thin film transistor connected to a scan line SL and a data line DL. The second thin film transistor T2 may transfer a data voltage input from the data line DL to the first thin film transistor T1 based on a switching voltage input from the scan line SL. The storage capacitor Cst may be connected to the second thin film transistor T2 and a driving voltage line PL. The storage capacitor Cst may store a voltage corresponding to a difference between a voltage transferred from the second thin film transistor T2 and a first power voltage ELVDD supplied through the driving voltage line PL.

The first thin film transistor T1 may include a driving thin film transistor connected to the driving voltage line PL and the storage capacitor Cst. The first thin film transistor T1 may control a driving current flowing through the organic light-emitting diode OLED from the driving voltage line PL in response to the voltage value stored in the storage capacitor Cst. The organic light-emitting diode OLED may emit light having a brightness level (e.g., a predetermined brightness level) by using the driving current. An opposite electrode (e.g. a cathode) of the organic light-emitting diode OLED may be connected to (e.g., or receive) a second power voltage ELVSS.

Though it is shown in FIG. 4 that the pixel circuit PC includes two thin film transistors and one storage capacitor, the present disclosure is not limited thereto. The number of thin film transistors and the number of storage capacitors may be variously modified depending on a design of the pixel circuit PC.

Referring back to FIG. 3, the first non-display area NDA1 may surround (e.g., around a periphery of) the opening area OA. The first non-display area NDA1 is an area in which a display element that emits light (e.g., an organic light emitting diode) is not arranged. Signal lines or a groove(s) described below may pass across the first non-display area NDA1. The signal lines may provide signals to the pixels P that are arranged around (or adjacent to) the opening area OA. A scan driver 1100, a data driver 1200, and a main power line may be arranged at (e.g., in or on) the second non-display area NDA2. The scan driver 1100 may provide a scan signal to each of the pixels P. The data driver 1200 may provide a data signal to each of the pixels P. The main power line may provide a first power voltage and/or a second power voltage. Although it is shown in FIG. 4 that the data driver 1200 is adjacent to one side of the substrate 100, the data driver 1200 may be arranged on a flexible printed circuit board (FPCB) that is electrically connected to a pad arranged on one side of the display panel 10 in another embodiment.

Figure 5:
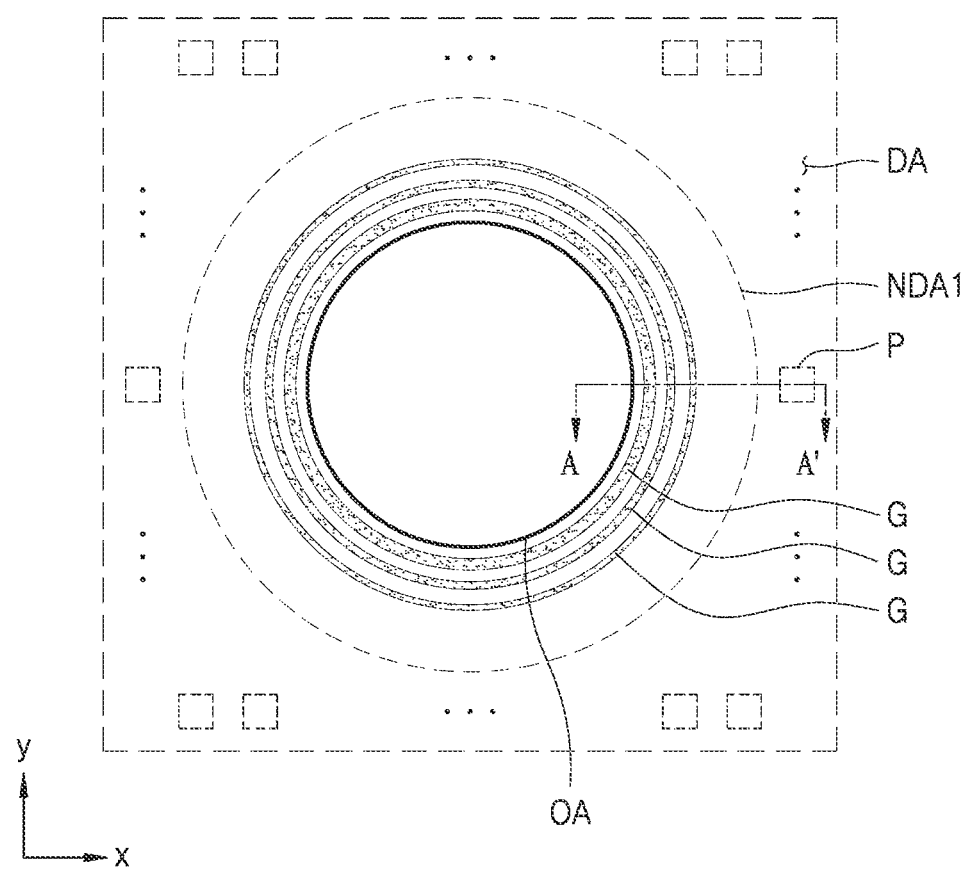
FIG. 5 is a plan view of a portion of a display panel according to an embodiment.

FIG. 5 is a plan view of a portion of a display panel according to an embodiment. FIG. 5 illustrates a groove located at (e.g., in or on) the first non-display area NDA1 that is adjacent to (e.g., neighbors) the opening area OA.

Referring to FIG. 5, at least one groove G is located between the opening area OA and the display area DA. For example, as shown in FIG. 5, in some embodiments, three grooves G are located between the opening area OA and the display area DA. However, the present disclosure is not limited thereto, and in other embodiments, for example, one, two, four, or more grooves may be arranged at (e.g., in or on) the first non-display area NDA1.

The grooves G may have a ring shape that surrounds (e.g., entirely surrounds) a periphery of the opening area OA at (e.g., in or on) the first non-display area NDA1 in a plan view. A diameter of each groove G may be greater than a diameter of the opening area OA. In a plan view, the grooves G surrounding the opening area OA may be spaced from each other by an interval (e.g., a predetermined interval).

In some embodiments, although not shown in detail in FIG. 5, bypass portions of a data line and/or a scan line that detours around the periphery (or edge) of the opening area OA may be located (e.g., formed or arranged) between the display area DA and a region at (e.g., in or on) which the grooves G are formed. That is, the grooves G may be closer (e.g., more adjacent) to the opening area OA than the data line and/or the scan line.

Figure 6A:
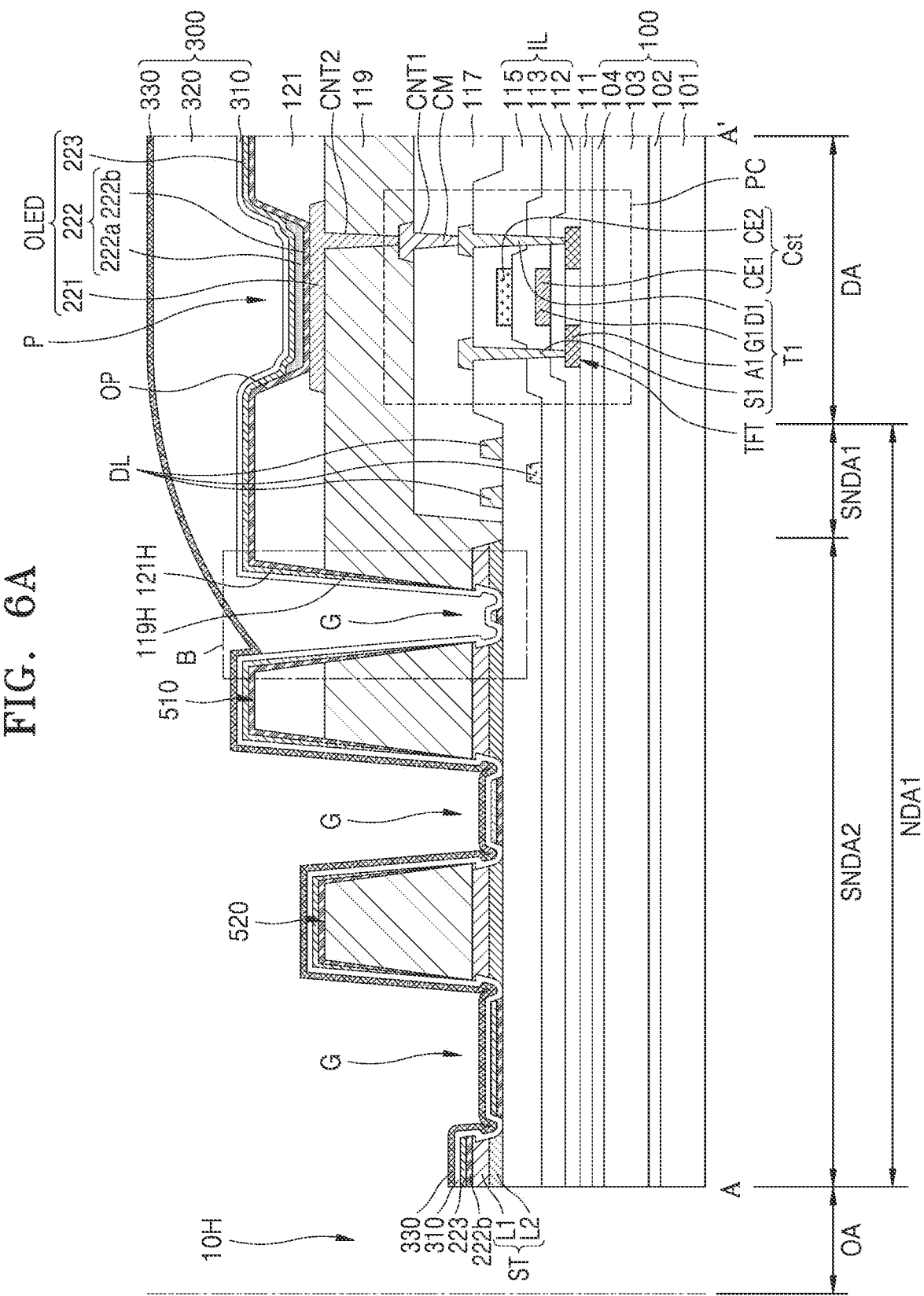
FIG. 6A is a cross-sectional view taken along the line A-A' of FIG. 5.

FIG. 6A is a cross-sectional view taken along the line A-A' of FIG. 5.

Referring to FIG. 6A, the display panel 10 includes the opening area OA, the display area DA, and the first non-display area NDA1 between the opening area OA and the display area DA. The display panel 10 may include a first opening 10H corresponding to the opening area OA.

As shown in FIG. 6A, the driving thin film transistor T1 and the storage capacitor Cst of the pixel circuit PC of each pixel described with reference to FIG. 4 are provided in the display area DA. For convenience of description, a structure arranged in the display area DA of FIG. 6A is described according to a stacking sequence.

In some embodiments, the substrate 100 may include a multi-layer structure. For example, the substrate 100 may include a first base layer 101, a first barrier layer 102, a second base layer 103, and a second barrier layer 104 that are stacked (e.g., sequentially stacked) on each other.

The first base layer 101 and the second base layer 103 may each include a polymer resin. For example, the first base layer 101 and the second base layer 103 may include a polymer resin including polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose tri acetate (TAC), and/or cellulose acetate propionate (CAP). The polymer resin may be transparent.

The first barrier layer 102 and the second barrier layer 104 may be barrier layers that prevent or reduce the penetration of external foreign substances, and may include a single layer or a multi-layer structure, for example, including an inorganic material such as silicon nitride ($SiN_x$) and/or silicon oxide ($SiO_x$).

A buffer layer 111 may be formed on the substrate 100. The buffer layer 111 may prevent or substantially prevent impurities from penetrating into a semiconductor layer Al of a thin film transistor TFT. The buffer layer 111 may include an inorganic insulating material such as, for example, silicon nitride, silicon oxide, and/or silicon oxynitride. The buffer layer 111 may include a single layer structure or a multi-layer structure including, for example, one or more of the above described inorganic insulating materials.

The semiconductor layer Al may be arranged on the buffer layer 111. In an example embodiment, the semiconductor layer Al may include amorphous silicon and/or polycrystalline silicon. In another embodiment, the semiconductor layer Al may include, for example, an oxide of at least one of In, Ga, Sn, Zr, V, Hf, Cd, Ge, Cr, Ti, Al, Cs, Ce, or Zn. In an embodiment, the semiconductor layer Al may include Zn oxide, In—Zn oxide, and/or Ga—In—Zn oxide as a Zn oxide-based material. In another embodiment, the semiconductor layer Al may include an IGZO (In—Ga—Zn—O) semiconductor, an ITZO (In—Sn—Zn—O) semiconductor, and/or an IGTZO (In—Ga—Sn—Zn—O) semiconductor including ZnO containing a metal such as In, Ga, and Sn. In some embodiments, the semiconductor layer Al may include a channel region, a source region, and a drain region, for example. The source region and the drain region may be arranged at (or on) opposite sides of the channel region. The semiconductor layer Al may include a single layer structure or a multi-layer structure.

A gate electrode G1 may be arranged on (e.g., over) the semiconductor layer Al. A gate insulating layer 112 may be between the gate electrode G1 and the semiconductor layer Al, such that the gate electrode G1 overlaps with at least a portion of the semiconductor layer Al. The gate electrode G1 may include at least one of Mo, Al, Cu, and/or Ti, and may include a single layer structure or a multi-layer structure. For example, in some embodiments, the gate electrode G1 may be a single layer structure of Mo. A first electrode CE1 (also referred to as a bottom electrode) of the storage capacitor Cst may be arranged at (or on) the same or substantially the same layer as a layer on which the gate electrode G1 is arranged. The first electrode CE1 may include the same or substantially the same material as that of the gate electrode G1.

The storage capacitor Cst includes the bottom electrode CE1 and a top electrode CE2 (also referred to as a second electrode) that overlaps with each other. A first interlayer insulating layer 113 may be between the bottom electrode CE1 and the top electrode CE2. The storage capacitor Cst may overlap with the thin film transistor TFT. For example, as shown in FIG. 6A, the gate electrode G1 may serve as the bottom electrode CE1 of the storage capacitor. In another embodiment, the storage capacitor Cst may not overlap with the thin film transistor TFT. In some embodiments, a second interlayer insulating layer 115 may be on the storage capacitor Cst. For example, in some embodiments, the storage capacitor Cst may be covered by the second interlayer insulating layer 115.

The first and second interlayer insulating layers 113 and 115 may include an inorganic insulating material such as, for example, silicon nitride, silicon oxide, silicon oxynitride, aluminum oxide, titanium oxide, tantalum oxide, and/or hafnium oxide. The first and second interlayer insulating layers 113 and 115 may include a single layer structure or a multi-layer structure including one or more of the above materials.

A source electrode S1 and a drain electrode D1 may be arranged on the first and second interlayer insulating layers 113 and 115.

The source electrode S1 and the drain electrode D1 may include a conductive material including, for example, Mo, Al, Cu, and/or Ti, and may include a single layer structure or a multi-layer structure including one or more of the above materials. For example, in some embodiments, the source electrode S1 and the drain electrode D1 may have a multi-layered structure of Ti/Al/Ti. The source electrode S1 and the drain electrode D1 may be connected to a source region and a drain region of the semiconductor layer A1, respectively, through contact holes formed in the first and second interlayer insulating layers 113 and 115.

The second electrode CE2 of the storage capacitor Cst overlaps with the first electrode CE1, with the second interlayer insulating layer 115 therebetween, and may constitute a capacitance. In this case, the second interlayer insulating layer 115 may serve as a dielectric layer of the storage capacitor Cst.

A first planarization layer 117 and a second planarization layer 119 may be arranged on the source electrode S1 and the drain electrode D1. An organic light-emitting diode OLED may be arranged on the first and second planarization layers 117 and 119.

A connection electrode CM (also referred to as a connection metal) may be arranged between the first planarization layer 117 and the second planarization layer 119. For example, the connection electrode CM may be arranged on the first planarization layer 117, and the second planarization layer 119 may be arranged on the connection electrode CM to cover the connection electrode CM.

The connection electrode CM may be connected to one of the source electrode S1 and the drain electrode D1 through a first contact hole CNT1 formed at (e.g., in or on) the first planarization layer 117. The connection electrode CM may be connected to a pixel electrode 221 (e.g., described in more detail below) through a second contact hole CNT2 formed at (e.g., in or on) the second planarization layer 119.

The first and second planarization layers 117 and 119 may include a single layer structure or a multi-layer structure including an organic material, for example, and may provide a planarized (or a flat) top surface. The first and second planarization layers 117 and 119 may include a general-purpose polymer, for example, such as benzocyclobutene (BCB), hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a mixture (or blend) thereof. In various embodiments, the first and second planarization layers 117 and 119 may include the same or substantially the same material, or may include different materials.

The organic light-emitting diode OLED may be arranged on the second planarization layer 119 at (e.g., in or on) the display area DA of the substrate 100. The organic light-emitting diode OLED may include the pixel electrode 221, an intermediate layer 222, and an opposite electrode 223. In some embodiments, the intermediate layer 222 may include an organic emission layer.

As described above, the pixel electrode 221 may be connected to the connection electrode CM through the second contact hole CNT2 formed at (e.g., in or on) the second planarization layer 119, and thus, the pixel electrode 221 may be electrically connected to one of the source electrode S1 or the drain electrode D1 through the connection electrode CM.

The pixel electrode 221 may include a transparent or semi-transparent electrode or a reflective electrode. In an embodiment, the pixel electrode 221 may include a reflective layer and a transparent or semi-transparent electrode layer on the reflective layer. In some embodiments, the reflective layer may include, for example, Ag, Mg, Al, Pt, Pd, Au, Ni, Nd, Ir, Cr, and/or a compound thereof. The transparent or semi-transparent electrode layer may include, for example, at least one of indium tin oxide (ITO), indium zinc oxide (IZO), zinc oxide (ZnO), indium oxide ($In_2O_3$), indium gallium oxide (IGO), and/or aluminum zinc oxide (AZO). For example, in an embodiment, the pixel electrode 221 may include ITO/Ag/ITO.

A pixel-defining layer 121 may be arranged on the second planarization layer 119. The pixel-defining layer 121 may define an emission area of a pixel by including an opening corresponding to each sub-pixel. For example, in some embodiments, the pixel-defining layer 121 may include an opening OP that exposes at least a central portion of the pixel electrode 221 at (e.g., in or on) the display area DA. In some embodiments, the pixel-defining layer 121 may prevent or reduce an arc (or the like) from occurring at edges of the pixel electrode 221 by increasing a distance between the edges of the pixel electrode 221 and the opposite electrode 223 overlapping with the pixel electrode 221.

The pixel-defining layer 121 may include at least one of organic insulating materials including, for example, polyimide, polyamide, an acrylic resin, BCB, and/or a phenolic resin, and may be formed by spin coating, and/or the like.

The intermediate layer 222 of the organic light-emitting diode OLED may include an emission layer 222a. The emission layer 222a may include an organic material including, for example, a fluorescent or phosphorous material that emits red, green, blue, or white light. The emission layer 222a may include a low molecular weight organic material and/or a polymer organic material.

A functional layer 222b may be arranged at (e.g., in or on) and/or under the emission layer 222a. The functional layer 222b may include a single layer structure or a multi-layer structure.

As shown in FIG. 6A, in the case where the functional layer 222b is arranged under the emission layer 222a, the functional layer 222b may include a hole transport layer (HTL) and/or a hole injection layer (HIL). For example, in the case where the functional layer 222b includes a polymer material, the functional layer 222b may include a hole transport layer (HTL), which may have a single-layered structure. The functional layer 222b may include, for example, poly-(3,4)-ethylene-dihydroxy thiophene (PEDOT) or polyaniline (PANI). In the case where the functional layer 222b includes a low molecular weight material, the functional layer 222b may include a hole injection layer (HIL) and a hole transport layer (HTL).

In some embodiments, although not shown in detail in FIG. 6A, an additional functional layer may be arranged on the emission layer 222a. For example, in the case where the functional layer 222b and/or the emission layer 222a include a polymer material, the additional functional layer may be included, in some embodiments. The additional functional layer may include a single layer structure or a multi-layer structure, and may include an electron transport layer (ETL) and/or an electron injection layer (EIL). However, the present disclosure is not limited thereto, and the additional functional layer may be omitted.

The emission layer 222a of the intermediate layer 222 may be arranged for each pixel in the display area DA. The functional layer 222b may contact a top surface of the pixel electrode 221 exposed through the opening of the pixel-defining layer 121. In some embodiments, the functional layer 222b and the additional functional layer of the intermediate layer 222 may be formed at (e.g., in or on) the display area DA as well as at (e.g., in or on) the first non-display area NDA1 shown in FIG. 6A.

The opposite electrode 223 may include a transparent or reflective electrode. In an embodiment, the opposite electrode 223 may include a transparent or semi-transparent electrode, and may include a metal thin layer including at least one of Li, Ca, LiF/Ca, LiF/Al, Al, Ag, Mg, and/or a compound thereof, and having a low work function. In some embodiments, a transparent conductive oxide (TCO) including, for example, ITO, IZO, ZnO, and/or $In_2O_3$ may be arranged on the metal thin layer. The opposite electrode 223 may be arranged at (e.g., in or on) the display area DA and the non-display area NDA. In some embodiments, the opposite electrode 223 may be arranged on the intermediate layer 222 and the pixel-defining layer 121.

In some embodiments, the opposite electrode 223 may be formed as one body on (e.g., over) a plurality of organic light-emitting diodes OLED, and thus, may correspond to a plurality of pixel electrodes 221. In some embodiments, the opposite electrode 223 may be formed at (e.g., in or on) the display area DA as well as the first non-display area NDA1.

The intermediate layer 222 and the opposite electrode 223 may be formed, for example, by thermal deposition.

In some embodiments, a capping layer may be further arranged on the opposite electrode 223. The capping layer may include, for example, LiF, an inorganic material, and/or an organic material. In some embodiments, like the opposite electrode 223, the capping layer may be formed at (e.g., in or on) the display area DA as well as the first non-display area NDA1.

In some embodiments, a spacer may be further arranged on the pixel-defining layer 121 to prevent or substantially prevent mask chopping. The spacer may be formed as one body with the pixel-defining layer 121. For example, the spacer and the pixel-defining layer 121 may be concurrently (e.g., simultaneously) formed during the same or substantially the same process by using a half-tone mask process.

In some embodiments, because the organic light-emitting diode OLED may be damaged (e.g., easily damaged) by external moisture or oxygen, the organic light-emitting diode OLED may be protected by an encapsulation substrate or a thin-film encapsulation layer that covers the organic light-emitting diode OLED. For example, in an embodiment, a thin-film encapsulation layer 300 may be arranged on the organic light-emitting diode OLED to cover a surface (e.g., an entire surface or substantially the entire surface) of the substrate 100. The thin-film encapsulation layer 300 may include at least one organic encapsulation layer and at least one inorganic encapsulation layer. For example, as shown in FIG. 6A, the thin-film encapsulation layer 300 may include first and second inorganic encapsulation layers 310 and 330, and an organic encapsulation layer 320 between the first and second inorganic encapsulation layers 310 and 330. However, the present disclosure is not limited thereto, and in other embodiments, the number of organic encapsulation layers, the number of inorganic encapsulation layers, and/or a stacking sequence thereof may be variously modified in a suitable manner as would be approved by those skilled in the art.

The first and second inorganic encapsulation layers 310 and 330 may include at least one inorganic insulating material from among, for example, aluminum oxide, titanium oxide, tantalum oxide, hafnium oxide, zinc oxide, silicon nitride, silicon oxide, and/or silicon oxynitride. The first and second inorganic encapsulation layers 310 and 330 may be formed by chemical vapor deposition (CVD), and/or the like.

The organic encapsulation layer 320 may include a polymer-based material. The polymer-based material may include, for example, an acrylic-based resin, an epoxy-based resin, polyimide, and/or polyethylene. The organic encapsulation layer 320 may be formed by coating a monomer including one or more of the above materials, and hardening the monomer.

Still referring to FIG. 6A, in some embodiments, the first non-display area NDA1 may include a first sub-non display area SNDA1 and a second sub-non display area SNDA2. The first sub-non display area SNDA1 may be closer to the display area DA than the second sub-non display area SNDA2, and the second sub-non display area SNDA2 may be closer to the opening area OA and/or the first opening 10H than the first sub-non display area SNDA1.

The first sub-non display area SNDA1 may be an area in which signal lines, for example, data lines DL, extend across. In this case, the data lines DL may correspond to data lines that detour around (e.g., a periphery of) the opening area OA (e.g., see FIG. 5). In this case, the first sub-non display area SNDA1 may include a wiring region along (or across) which the data lines DL extend (e.g., pass).

As shown in FIG. 6A, in some embodiments, the data lines DL may be alternately arranged with the insulating layer (e.g., the second insulating layer 115) therebetween. In other embodiments, the data lines DL may be arranged on the same or substantially the same insulating layer. In the case where the data lines DL are alternately arranged under and/or on the insulating layer (e.g. the second interlayer insulating layer 115), a gap (e.g., a pitch) between the data lines DL that are adjacent to each other may be reduced, and thus, a width of the first non-display area NDA1 may be reduced. While FIG. 6A shows that the data lines DL are located in the first sub-non display area SNDA1, the present disclosure is not limited thereto, and scan lines may be located in the first sub-non display area SNDA1. In this case, the scan lines may detour around (e.g., extend around a periphery of) the opening area OA (e.g., see FIG. 5) while crossing the data lines DL.

The second sub-non display area SNDA2 may include a groove region at (e.g., in or on) which the grooves G are arranged. FIG. 6A shows three grooves G located at (e.g., in or on) the second sub-non display area SNDA2, but the present disclosure is not limited thereto, and the number of grooves G may be more or less than three.

The grooves G may be formed, for example, by removing some of the sub-metal layers included in a metal stacked structure ST arranged on (e.g., over) the substrate 100. The metal stacked structure ST may be arranged on an inorganic insulating layer IL. In some embodiments, the inorganic insulating layer IL includes one or more insulating layers, for example, such as the gate insulating layer 112, the first interlayer insulating layer 113, and the second interlayer insulating layer 115, that are arranged between the thin film transistor TFT and the storage capacitor Cst. In other embodiments, the inorganic insulating layer IL may further include the buffer layer 111 and/or the second barrier layer 104. However, the present disclosure is not limited thereto, and in some embodiments, one or more of the second barrier layer 104, the buffer layer 111, the gate insulating layer 112, the first interlayer insulating layer 113, and the second interlayer insulating layer 115 of the inorganic insulating layer IL may be omitted.

The metal stacked structure ST may include a first metal layer L1 and a second metal layer L2. Each of the first metal layer L1 and/or the second metal layer L2 may include a plurality of sub-layers. The first metal layer L1 may include the same or substantially the same material as that of the connection metal CM at (e.g., in or on) the display area DA, and the second metal layer L2 may include the same or substantially the same material as that of at least one of the source electrode S1 and the drain electrode D1 at (e.g., in or on) the display area DA. However, the present disclosure is not limited thereto, for example, in other embodiments, the second metal layer L2 may be omitted, and the first metal layer L1 may be arranged directly on the inorganic insulating layer IL.

Figure 6B:
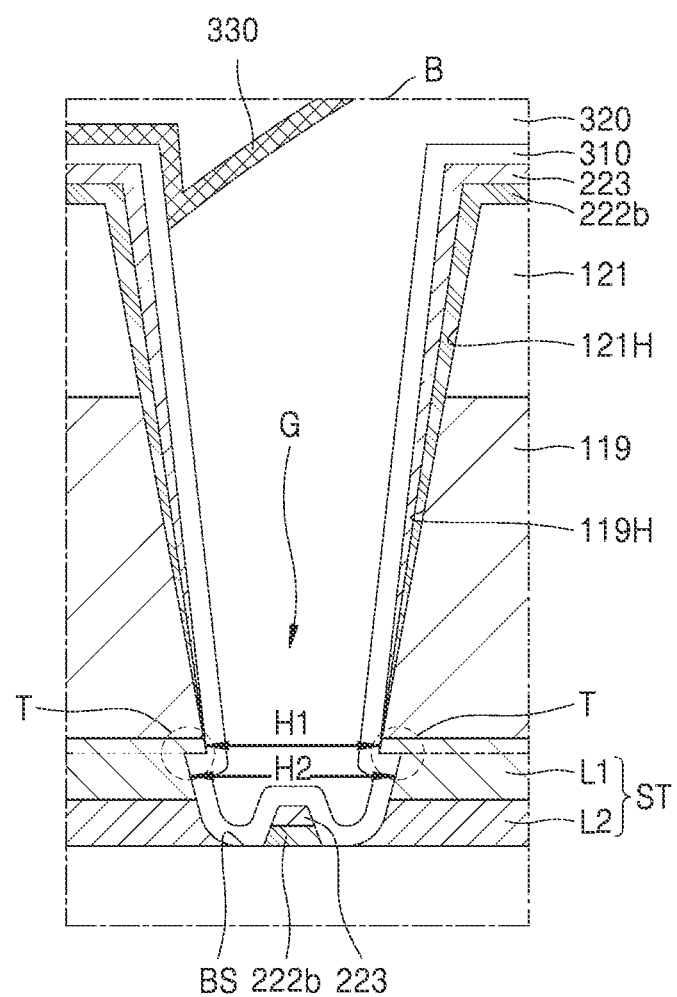
FIG. 6B is an enlarged cross-sectional view of the portion B of FIG. 6A.
Figure 6C:
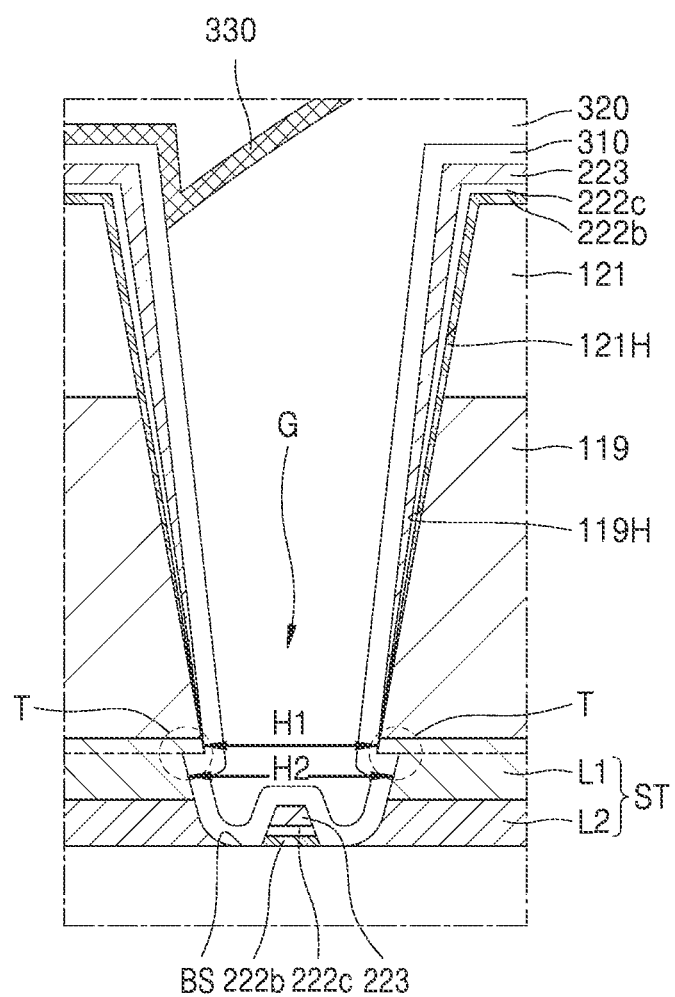
FIG. 6C is a cross-sectional view of a modified embodiment of FIG. 6B.

FIG. 6B is an enlarged cross-sectional view of the portion B of FIG. 6A, and FIG. 6C is a cross-sectional view of a modified embodiment of FIG. 6B. As shown in FIG. 6B, the groove G defined at (e.g., in or on) the metal stacked structure ST may be formed such that holes (e.g., H1 and H2) corresponding to the sub-metal layers of the metal stacked structure ST overlap with each other. In the metal stacked structure ST, a width of a first hole H1 formed at (e.g., in or on) a sub-metal layer on an uppermost layer of the metal stacked structure ST may be less than a width of a second hole H2 formed in a sub-metal layer(s) underneath the first hole H1. For example, an edge of the sub-metal layer on the uppermost layer of the metal stacked structure ST that defines the first hole H1 may protrude further toward a center of the first hole H1 than an edge of a sub-metal layer that defines the second hole H2.

The groove G may be formed before a process of forming the intermediate layer 222 at (e.g., in or on) the display area DA. Because a layer including an organic material included in the display device serves as a moisture transmission path through which moisture may progress, formation of the moisture transmission path may be prevented or substantially prevented by separating or disconnecting an organic material layer, for example, the functional layer 222b adjacent to the groove G. In this case, the organic material layer (e.g., the functional layer 222b) is formed at (e.g., in or on) the display area DA as well as the first non-display area NDA1. Similar to the organic material layer (e.g., the functional layer 222b), the opposite electrode 223 formed by thermal deposition may be separated or disconnected at a portion adjacent to the groove G. For example, as shown in FIG. 6B, a portion of the functional layer 222b and a portion of the opposite electrode 223 remains on a base surface BS of the groove G. In another embodiment, referring to FIG. 6C, the intermediate layer 222 may include the additional functional layer 222c on the emission layer 222a. In this case, the functional layer 222b, the additional functional layer 222c, and the opposite electrode 223 may be disconnected by the groove G. In this case, portions of the functional layer 222b, the additional functional layer 222c, and the opposite electrode 223 that are separated may remain on the base surface BS of the groove G. The base surface BS of the groove G may be located on the same or substantially the same surface as a top surface of the insulating layer underneath the metal stacked structure ST.

At least one insulating layer may be arranged on the metal stacked structure ST. For example, as shown in FIGS. 6A and 6B, at least one organic insulating layer, for example, the second planarization layer 119 and the pixel-defining layer 121, may be provided on the metal stacked structure ST. In another embodiment, an inorganic insulating layer may be arranged on the metal stacked structure ST, or an inorganic insulating layer and an organic insulating layer may be arranged on the metal stacked structure ST. As shown in FIG. 6A, the organic insulating layer arranged on the metal stacked structure ST may be spaced apart in a lateral direction (a horizontal direction or a direction parallel to the top surface of the substrate 100 in FIG. 6A) from an edge of the substrate 100 that defines the first opening 10H by a distance (e.g., a predetermined distance).

At least one insulating layer on the metal stacked structure ST includes a hole overlapping with the groove G. A diameter of the hole may be equal to or greater than a diameter of the first hole of the sub-metal layer, which is the uppermost layer of the metal stacked structure ST, the first hole defining the groove G. For example, the second planarization layer 119 and the pixel-defining layer 121 may extend to the second sub-non display area SNDA2 to cover a portion of the groove G. The second planarization layer 119 and the pixel-defining layer 121 may include a hole 119H and a hole 121H, respectively, overlapping with the groove G. As shown in FIG. 6B, in the case where the second planarization layer 119 and the pixel-defining layer 121 include an inclined lateral surface, diameters of the holes 121H and 119H may be variously changed in a suitable manner as would be approved by those skilled in the art. For example, the holes 121H and 119H may have diameters measured at a portion neighboring a bottom surface.

At least one partition wall may be adjacent to (or neighbor) the groove G. For example, the partition wall may be formed between grooves G that are adjacent to each other. For example, a first partition wall 510 and a second partition wall 520 may be formed in the second sub-non display area SNDA2 in a sequence adjacent to the display area DA.

The first partition wall 510 and/or the second partition wall 520 may serve as a dam to control the flow of an organic material during a process of forming the organic encapsulation layer 320. In an embodiment, one of the first partition wall 510 and the second partition wall 520 may be omitted. In some embodiments, although not shown in detail in FIG. 6A, the first partition wall 510 may further include a spacer on the pixel-defining layer 121, in addition to the second planarization layer 119 and the pixel-defining layer 121.

A groove G that is adjacent to the display area DA from among the plurality of grooves G may be at least partially filled with a portion of the organic encapsulation layer 320. The first inorganic encapsulation layer 310 may cover (e.g., entirely and continuously cover) an inner surface of the groove G. A portion of the second inorganic encapsulation layer 330 may contact (e.g., directly contact) the first inorganic encapsulation layer 310 in the second sub-non display area SNDA2. For example, the second inorganic encapsulation layer 330 may contact (e.g., directly contact) the first inorganic encapsulation layer 310 at (e.g., on) at least one groove G from among the plurality of grooves G. The first and second inorganic encapsulation layers 310 and 330 may contact each other on top surfaces of the first and second partition walls 510 and 520.

Figure 7:
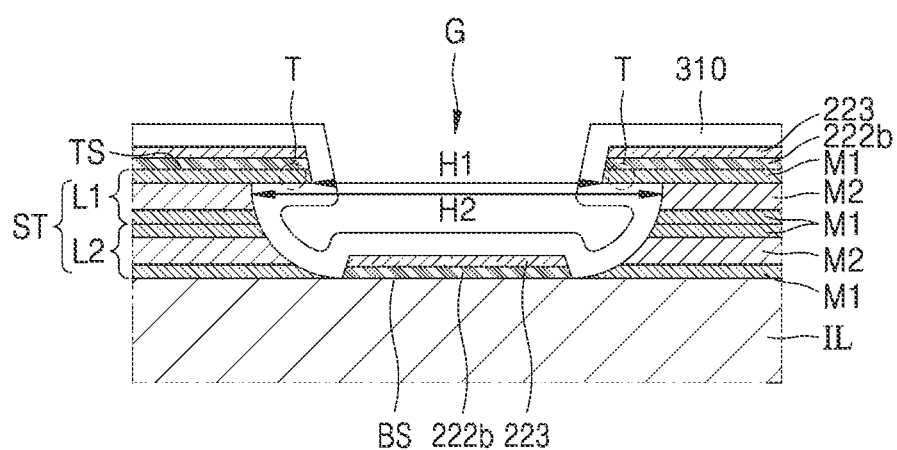
FIGS. 7 to 9 are cross-sectional views of a groove on a display panel according to an embodiment.

FIG. 7 is a cross-sectional view of an example of a groove on a display panel according to an embodiment.

First, referring to FIG. 7, the second metal layer L2 may be arranged on the inorganic insulating layer IL, and the first metal layer L1 may be arranged on the second metal layer L2. As described above, the second metal layer L2 may include the same or substantially the same material as that of at least one of the source electrode S1 (and the drain electrode D1 of the thin film transistor TFT (e.g., see FIG. 6A), and the first metal layer L1 may include the same or substantially the same material as that of the connection metal CM (e.g., see FIG. 6A).

At least one of the first metal layer L1 and the second metal layer L2 may include a plurality of sub-layers. For example, in an embodiment, the first metal layer L1 may include a first sub-layer M1 and a second sub-layer M2. The first sub-layer M1 may include one or more different materials from that of the second sub-layer M2. In this case, the first sub-layer M1 may include Ti, and the second sub-layer M2 may include Al, for example. For example, the first sub-layer M1 and the second sub-layer M2 may be sequentially and/or alternately stacked in a stack structure (e.g., a sandwich structure) of Ti/Al/Ti.

In an embodiment, the second metal layer L2 may include the same or substantially the same material as that of the first metal layer L1. In this case, like the first metal layer L1, the second metal layer L2 may be formed in a stack structure (e.g., a sandwich structure) of Ti/Al/Ti, in which the first sub-layer M1 and the second sub-layer M2 are sequentially and/or alternately stacked.

The metal stacked structure ST including the first metal layer L1 and the second metal layer L2 includes a plurality of sub-metal layers. A groove G having a concave shape in a thickness direction may be defined in the metal stacked structure ST. The groove G may include holes formed at (e.g., in or on) a sub-metal layer on an uppermost layer of the metal stacked structure ST from among the plurality of sub-metal layers, and at (e.g., in or on) at least one sub-metal layer thereunder.

For example, the first sub-layer M1 may include the first hole H1. The first sub-layer M1 may be on a top surface of a sub-metal layer that is the uppermost layer of the metal stacked structure ST, for example, the first metal layer L1. The second sub-layer M2 of the first metal layer L1 underneath the first sub-layer M1 may include the second hole H2 having a width that is greater than that of the first hole H1. An edge of the top first sub-layer M1 of the first metal layer L1 that defines the first hole H1 may include a tip T that extends (e.g., protrudes) further toward a center of the first hole H1 than an edge of the second sub-layer M2 of first metal layer L1 that defines the second hole H2.

The one or more sub-metal layers (e.g., bottom sub-metal layers) underneath the second sub-layer M2 of the first metal layer L1 include a hole. An edge of each of the one or more sub-metal layers underneath the second sub-layer M2 of the first metal layer L1 that defines the hole may define a surface (e.g., a lateral surface) of the groove G in cooperation with the edge of the second sub-layer M2 of the first metal layer L1.

For example, a width (e.g., a diameter) of a hole of each of a first bottom sub-layer M1 of the first metal layer L1, a first top sub-layer M1 of the second metal layer L2, and the second sub-layer M2 of the second metal layer L2 may be greater than a width (e.g., a diameter) of the first hole H1. When a depth from an eave structure of the metal stacked structure ST is sufficiently secured, a width (e.g., a diameter) of a hole of a sub-metal layer that is a lowermost layer of the metal stacked structure ST may be greater than, less than, or equal to the width (or diameter) of the first hole H1.

At least one organic material layer of the intermediate layer 222 and the opposite electrode 223 may be separated or disconnected through a structure, for example, an undercut structure or an eave structure, in which an edge of the first top sub-layer M1 of the first metal layer L1 extends (e.g., protrudes) further than an edge of the second sub-layer M2 of the first metal layer L1. For example, as shown in FIG. 7, the at least one organic material layer of the intermediate layer 222 includes the functional layer 222b, and the functional layer 222b and the opposite electrode 223 are separated (e.g., have disconnected portions). A portion of the functional layer 222b and the opposite electrode 223 that are separated (or disconnected) may be located on the base surface BS of the groove G. In another embodiment, the at least one organic material layer of the intermediate layer 222 may include the functional layer 222b and the additional functional layer 222c described with reference to FIG. 6C. Unlike the functional layer 222b and the opposite electrode 223, the first and second inorganic encapsulation layers 310 and 330 may cover (e.g., entirely and continuously cover) a top surface of the opposite electrode 223 and an inner surface of the groove G.

Although FIG. 7 illustrates that the groove G is formed by removing the first metal layer L1 and the second metal layer L2, in some embodiments, a portion of the inorganic insulating layer IL may be removed during a process of forming the groove G. Therefore, the base surface BS of the groove G may be located lower than a top surface TS of the first metal layer L1. For example, the base surface BS of the groove G may be a surface that contacts a top surface of the inorganic insulating layer IL, or may be a surface that contacts an intermediate layer of the inorganic insulating layer IL.

While FIG. 7 shows that a separate insulating layer is not arranged on the metal stacked structure ST, the present disclosure is not limited thereto. For example, in other embodiments, as shown in FIGS. 8 and 9, an insulating layer (e.g., an inorganic insulating layer and/or an organic insulating layer) may be arranged on the metal stacked structure ST.

Figure 8:
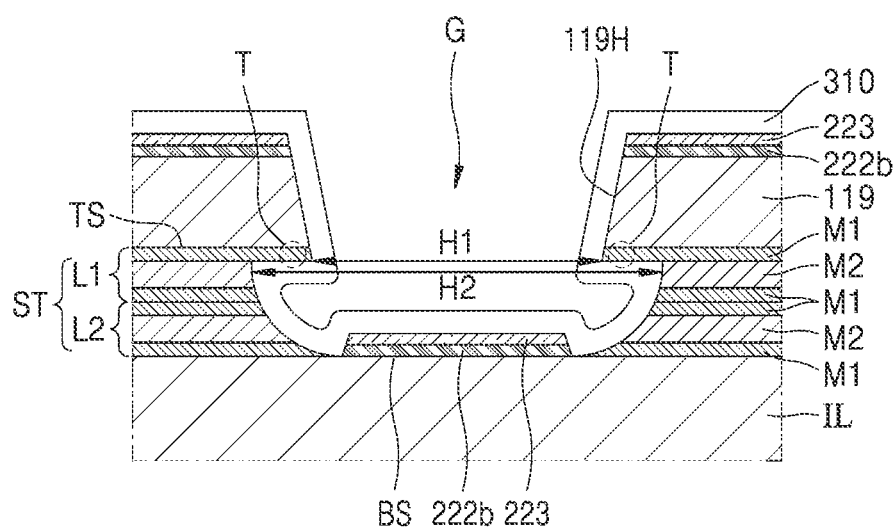
Figure 9:
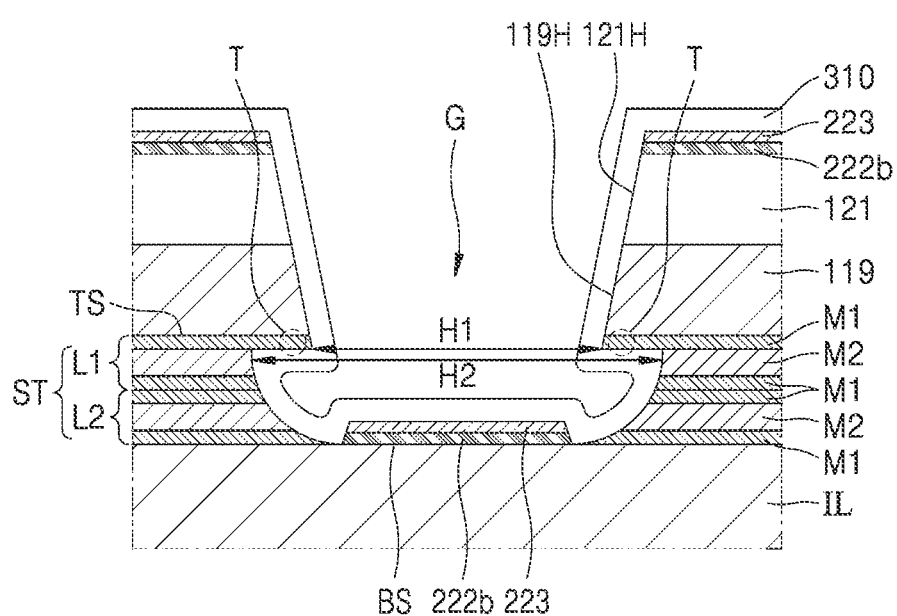

FIGS. 8 to 9 are cross-sectional views of examples of a groove on a display panel according to example embodiments.

The embodiments shown in FIGS. 8 and 9 are similar to or substantially the same as the embodiment shown in FIG. 7, except that organic insulating layers including the second planarization layer 119 and/or the pixel-defining layer 121 are further arranged between the first metal layer L1 and the functional layer 222b. Therefore, differences between the embodiments shown in FIGS. 8 and 9 and the embodiment shown in FIG. 7 is mainly described in more detail.

Referring to FIGS. 8 and 9, an insulating layer may be further arranged on the metal stacked structure ST. For example, in various embodiments, as shown in FIG. 8, the second planarization layer 119 may be arranged on the metal stacked structure ST, and as shown in FIG. 9, the second planarization layer 119 and the pixel-defining layer 121 may be arranged on the metal stacked structure ST.

As described above, the functional layer 222b and the opposite electrode 223 may be separated or disconnected by the groove G (e.g., may each have separated or disconnected portions). In some embodiments, in the case where the insulating layer is further arranged on the metal stacked structure ST defining the groove G, the separation or disconnection (e.g., the separated or disconnected portion) may be more easily performed due to a height difference of the relevant insulating layer(s). In some embodiments, the second planarization layer 119 and/or the pixel-defining layer 121 may protect the metal stacked structure ST and may prevent the destruction of the tip T.

The second planarization layer 119 and/or the pixel-defining layer 121 may respectively include the holes 119H and 121H, and the widths (e.g., the diameters) of the holes 119H and 121H may be substantially the same as or greater than (e.g., greater than or equal to) the width (e.g., the diameter) of the first hole H1 as described above.

In some embodiments, although not shown in detail in FIGS. 8 and 9, portions of the functional layer 222b and the opposite electrode 223 that are disconnected (e.g., the separated or disconnected portions) and located on the second planarization layer 119 and/or the pixel-defining layer 121 may at least partially overlap with (e.g., cover) lateral surfaces of the second planarization layer 119 and/or the pixel-defining layer 121 that define the holes 119H and 121H. For example, similar to the functional layer 222b and the opposite electrode 223 that overlap with (or cover) a lateral surface of each of the hole 121H formed in the pixel-defining layer 121 and the hole 119H formed in the second planarization layer 119 shown in FIG. 6A, the separated or disconnected portions of the functional layer 222b and the opposite electrode may at least partially overlap with (or cover) the lateral surfaces of the second planarization layer 119 and/or the pixel defining layer 121 that define the holes 119H and 121H.

Although FIGS. 8 and 9 show that the at least one organic material layer of the intermediate layer 222 includes the functional layer 222b, the present disclosure is not limited thereto. For example, in another embodiment, as described with reference to FIG. 6C, the at least one organic material layer of the intermediate layer 222 may include the functional layer 222b and the additional functional layer 222c.

FIGS. 10A-10G are sequential cross-sectional views of a process of manufacturing a display device according to an embodiment. For example, the cross-sectional views of FIGS. 10A-10G may correspond to the portion B of FIG. 6A.

Figure 10A:
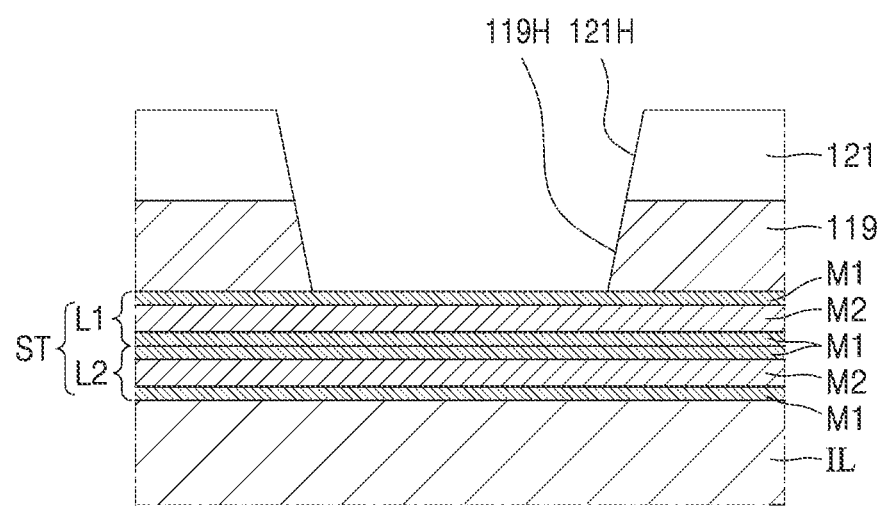
FIGS. 10A-10G are sequential cross-sectional views of a process of manufacturing a display device according to an embodiment.

As shown in FIG. 10A, the metal stacked structure ST including the second metal layer L2 and the first metal layer L1 is formed on the inorganic insulating layer IL. The second metal layer L2 and the first metal layer L1 may be located at (e.g., in or on) the first non-display area NDA1 of FIG. 6A, and the inorganic insulating layer IL may be located in the display area DA and the first non-display area NDA1 of FIG. 6A.

The second planarization layer 119 and the pixel-defining layer 121 may be stacked (e.g., sequentially stacked) on the first metal layer L1. In other embodiments, at least one of the second planarization layer 119 and the pixel-defining layer 121 may be omitted. Still in other embodiments, the second metal layer L2 may be omitted, and the first metal layer L1 may be stacked on (e.g., directly on) the inorganic insulating layer IL.

In some embodiments, the metal stacked structure ST may be formed after the thin film transistor TFT, the storage capacitor Cst, the connection metal CM, and the pixel electrode 221 are each formed in the display area DA (e.g., as shown in FIG. 6A). In some embodiments, the second metal layer L2 may be concurrently (e.g., simultaneously) formed during an operation of forming the source electrode S1 and/or the drain electrode D1 of the thin film transistor TFT (e.g., see FIG. 6A). In some embodiments, the first metal layer L1 may be concurrently (e.g., simultaneously) formed during an operation of forming the connection metal CM (e.g., see FIG. 6A). As described above, in some embodiments, the second planarization layer 119 may be formed after the connection metal CM is formed, the pixel-defining layer 121 may be formed after the pixel electrode 221 is formed, and the second planarization layer 119 and/or the pixel-defining layer 121 may be formed at (e.g., in or on) the display area DA as well as the first non-display area NDA1 (e.g., see FIG. 6A).

Still referring to FIG. 10A, the holes 119H and 121H may be respectively formed (e.g., formed in advance) at locations of the second planarization layer 119 and the pixel-defining layer 121 corresponding to the groove G (e.g., see FIG. 9).

Figure 10B:
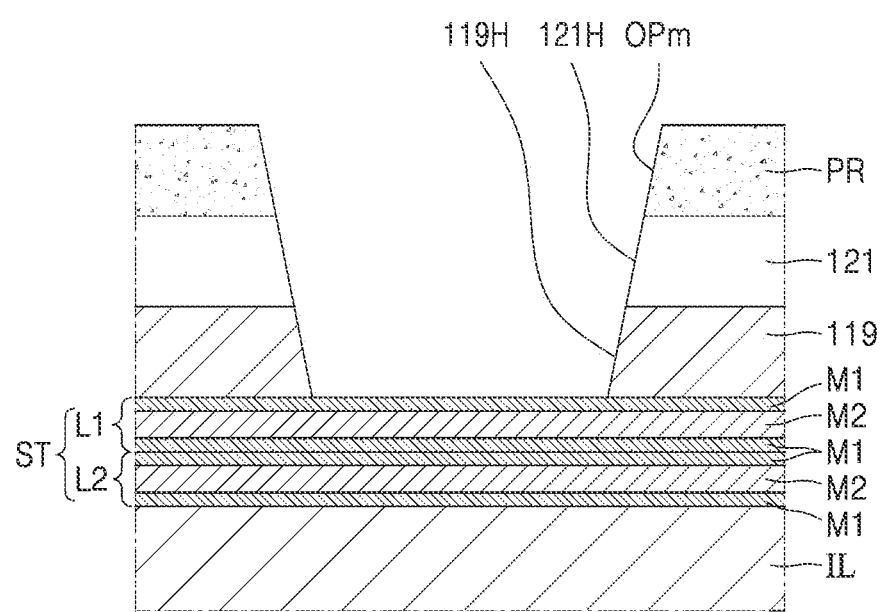

Next, as shown in FIG. 10B, a photoresist layer PR may be formed on the pixel-defining layer 121. An opening OPm may be provided at (e.g., in or on) the photoresist layer PR. The opening OPm may correspond to a location at which the groove G (e.g., see FIG. 9) is to be formed. The opening OPm of the photoresist layer PR corresponds to the hole 119H of the second planarization layer 119 and the hole 121H of the pixel-defining layer 121 (e.g., that are formed in advance). Accordingly, an operation of aligning the photoresist layer PR to the organic insulating layers thereunder (e.g., the second planarization layer 119 and/or the pixel-defining layer 121) may be performed.

Figure 10C:
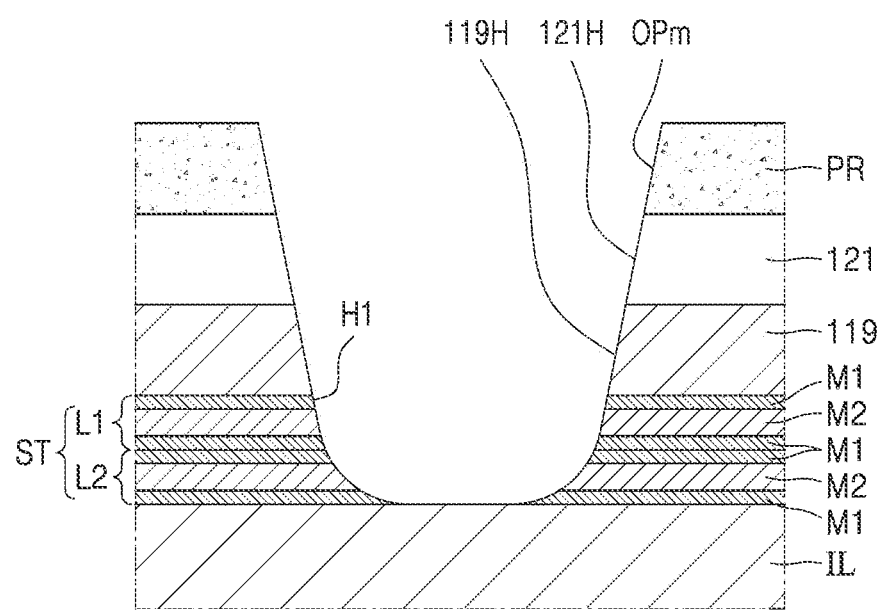

Next, as shown in FIG. 10C, the first hole H1 may be formed in the first metal layer L1 and the second metal layer L2 using the photoresist layer PR as a mask. The first hole H1 may correspond to the opening OPm of the photoresist layer PR. The photoresist layer PR may maintain or substantially maintain a function as a patterning mask, and may remain until the forming of the groove G (e.g., see FIG. 9) is completed.

During a process of forming the first hole H1 of the sub-metal layer on the uppermost layer of the metal stacked structure ST, portions of the sub-metal layers underneath the uppermost layer may be removed. For example, the first hole H1 may be formed by concurrently (e.g., simultaneously) removing portions of the first metal layer L1 and the second metal layer L2. Portions of the first metal layer L1 and the second metal layer L2 may be removed at a time by using dry etching, for example.

Although FIG. 10C shows that portions of the first metal layer L1 and the second metal layer L2 are removed, in some embodiments, a portion of the inorganic insulating layer IL underneath the second metal layer L2 may also be concurrently (e.g., simultaneously) removed.

Figure 10D:
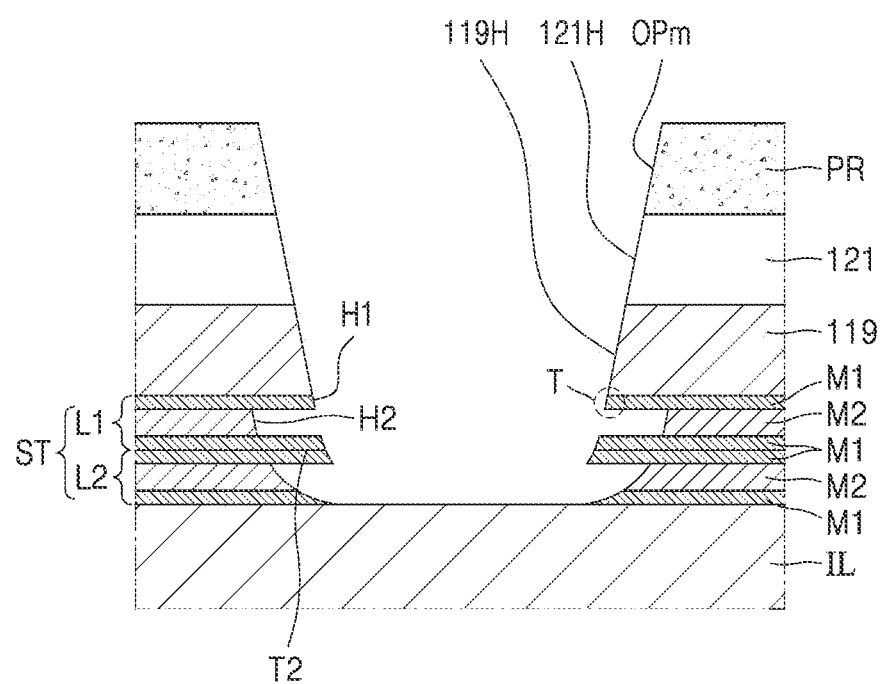

Next, as shown in FIG. 10D, the second hole H2 is formed in the second sub-layer M2 of the first metal layer L1 and in the second sub-layer M2 of the second metal layer L2. The second hole H2 may correspond to the first hole H1 formed during the previous operation (e.g., see FIG. 10C). In some embodiments, to implement an undercut structure or an eave structure, the second hole H2 having a size and/or a width (e.g., a diameter) greater than that of the first hole H1 is formed in the second sub-layer M2.

In some embodiments, the second hole H2 may be removed at a time by using wet etching. In an embodiment, during a wet etching process, the first sub-layer M1 including the material Ti may be relatively less etched or may not be etched, and the second sub-layer M2 including the material Al may be relatively more etched than the first sub-layer M1. Because a width (e.g., a diameter) of the second hole H2 is greater than a width (e.g., a diameter) of the first hole H1, an edge of the first sub-layer M1 that defines the first hole H1 has a tip T that extends (e.g., protrudes) further toward the center of the first hole H1 than an edge of the second sub-layer M2 that defines the second hole H2.

In an embodiment, in the case where the second metal layer L2 includes the same or substantially the same material as that of the first metal layer L1, the second sub-layer M2 of the second metal layer L2 may be concurrently (e.g., simultaneously) etched during a process of forming the second hole H2. In this case, a tip T2 (referred to as a second tip, hereinafter) may be formed on the second metal layer L2.

Figure 10E:
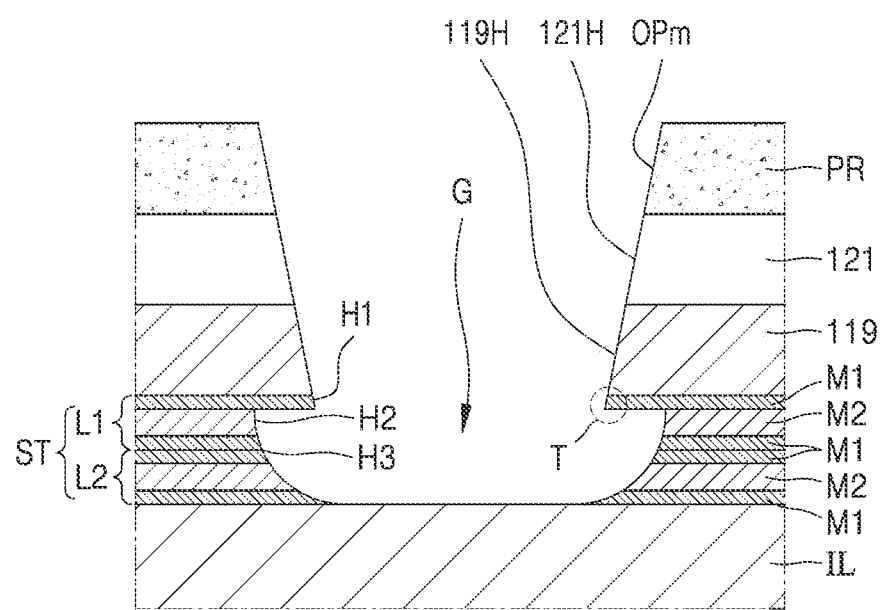

Next, as shown in FIG. 10E, the second tip T2 may be removed, and a lateral surface of the sub-metal layers below the tip T of the uppermost layer of the metal stacked structure ST, may define an inclination surface (e.g., a relatively gentle inclination surface). A width (e.g., a diameter) of a hole formed in some sub-metal layers below the tip T, for example, the third hole H3 of the first sub-layers M1, may be greater than the width (e.g., diameter) of the first hole H1, or may be the same as or substantially the same as (or similar to) the second hole H2.

Figure 10F:
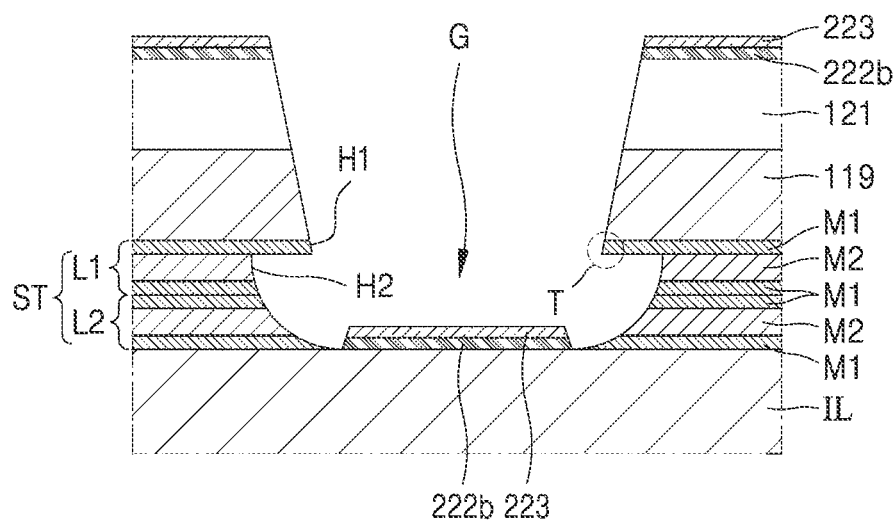

In some embodiments, as shown in FIG. 10F, the photoresist layer PR may be removed. At least one organic material layer (e.g., included in the intermediate layer) and the opposite electrode 223 may be stacked during a process of forming the intermediate layer. In this case, the at least one organic material layer (e.g., included in the intermediate layer) and the opposite electrode 223 may be separated or disconnected by the undercut/eave structure under the tip T. For example, in some embodiments, as shown in FIG. 10F, the functional layer 222b included in the intermediate layer and the opposite electrode 223 are separated or disconnected.

Figure 10G:
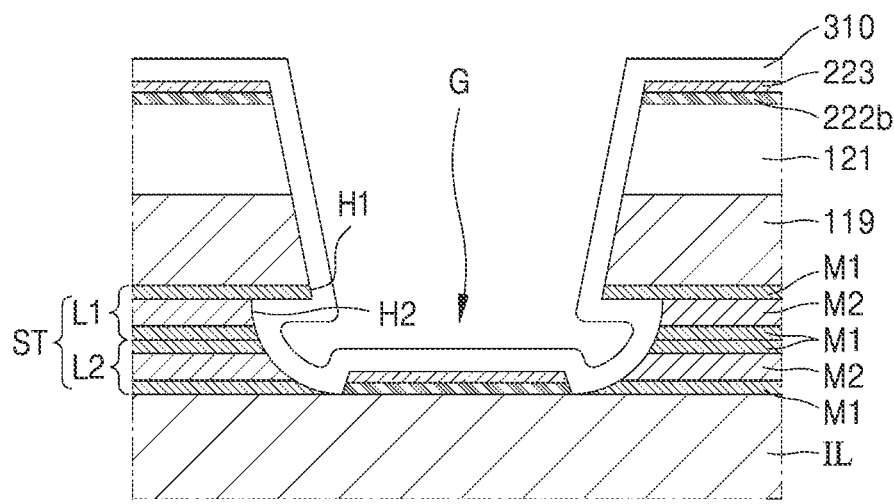

Next, as shown in FIG. 10G, the first inorganic encapsulation layer 310 is formed on the functional layer 222b and the opposite electrode 223 that are disconnected.

During this operation, the first inorganic encapsulation layer 310 is not disconnected and may cover (e.g., entirely and continuously cover) a top surface of the opposite electrode 223 and the inner surface of the groove G.

Hereinafter, an embodiment of a manufacturing process different from that shown in FIGS. 10A-10G is described with reference to FIGS. 11A-11G.

FIGS. 11A-11G are cross-sectional views of a process of manufacturing a display device according to another embodiment. The cross-sectional views of FIGS. 11A-11G may correspond to the portion B shown in FIG. 6A.

Figure 11A:
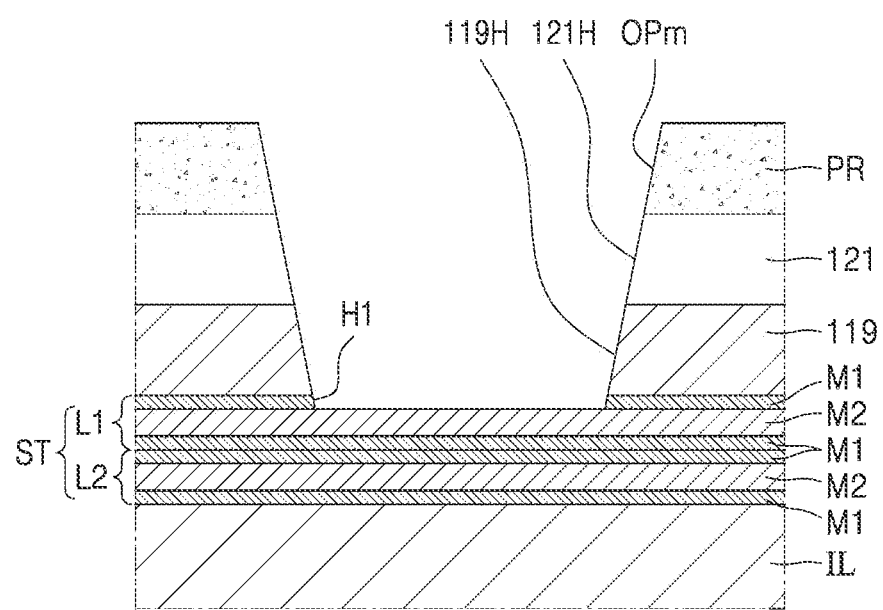
FIGS. 11A-11G are sequential cross-sectional views of a process of manufacturing a display device according to an embodiment.

As shown in FIG. 11A, the metal stacked structure ST, the second planarization layer 119, and the pixel-defining layer 121 may be stacked (e.g., sequentially stacked) on the inorganic insulating layer IL. In some embodiments, the metal stacked structure ST includes the second metal layer L2 and the first metal layer L1. The photoresist layer PR may be formed on the pixel-defining layer 121. In some embodiments, the processes of forming the metal stacked structure ST, the second planarization layer 119, the pixel-defining layer 121, and the photoresist layer PR may be the same as or substantially the same as (e.g., similar to) the processes described with reference to FIGS. 10A and 10B, and thus, redundant description thereof may be omitted.

After the photoresist layer PR is formed, the hole H1 is formed in the first metal layer L1, such that the hole H1 corresponds to the opening OPm of the photoresist layer PR. In this case, as described above, the photoresist layer PR maintains or substantially maintains a function as a patterning mask, and may remain until a process of forming a hole in each of the sub-metal layers of the metal stacked structure ST is completed.

Still referring to FIG. 11A, the first hole H1 may be formed first in the first top sub-layer M1 of the first metal layer L1, which is the uppermost layer of the metal stacked structure ST. In an embodiment, the first sub-layer M1 may include the material Ti, and the first hole H1 may be formed by using dry etching.

Figure 11B:
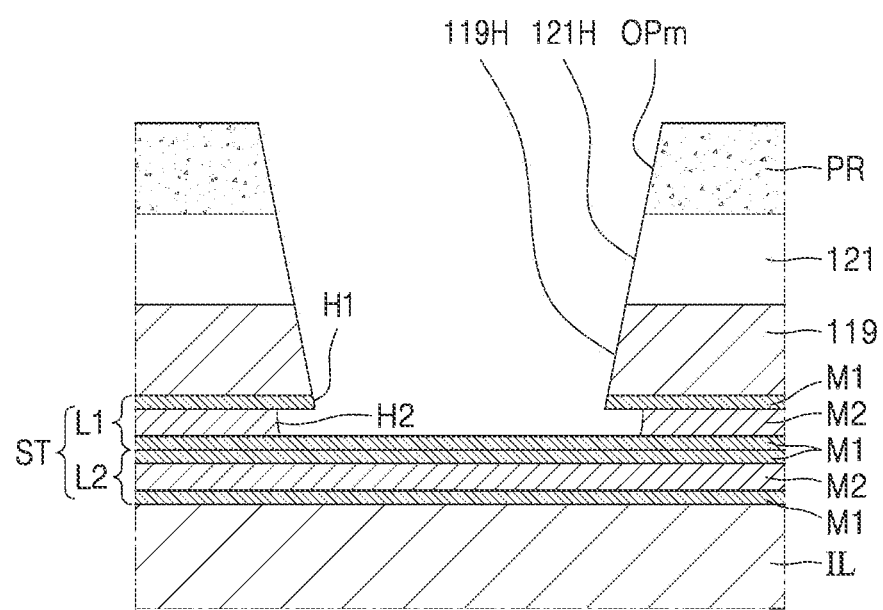

Next, as shown in FIG. 11B, the second hole H2 is formed in the second sub-layer M2 of the first metal layer L1. The second hole H2 overlaps with the first hole H1, and may have a relatively larger width (e.g., diameter) than that of the first hole H1. Accordingly, an undercut structure or an eave structure may be formed.

Unlike the embodiment described with reference to FIGS. 10A to 10G (e.g., see FIG. 10D) in which the second sub-layers M2 of the first metal layer L1 and the second metal layer L2, respectively, are removed at a time (e.g., concurrently), the second hole H2 is formed by removing only the second sub-layer M2 of the first metal layer L1 as shown in FIG. 11B. In an embodiment, the second sub-layer M2 including the material Al may be removed by wet etching.

Figure 11C:
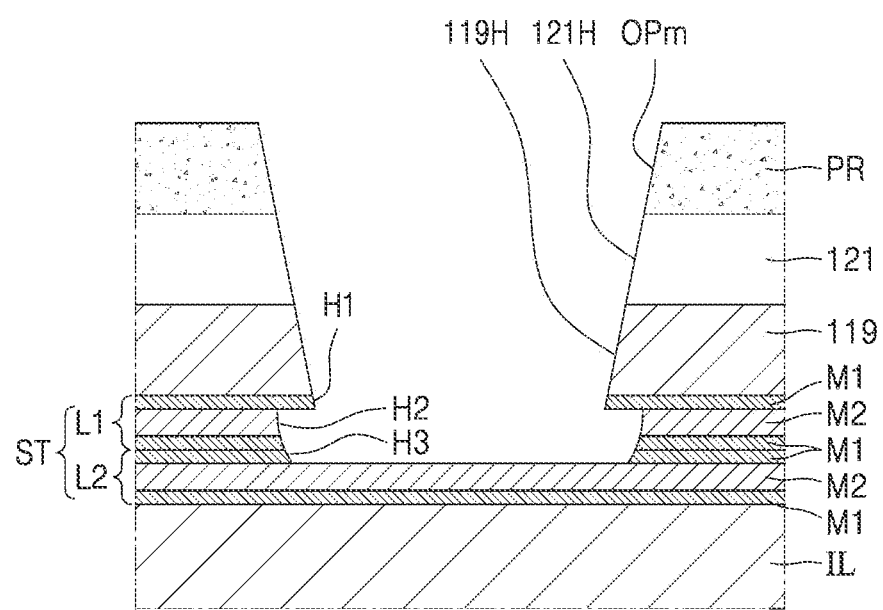

Next, as shown in FIG. 11C, the third hole H3 is formed at (e.g., in or on) the first sub-layer M1, which may be the lowermost layer of the first metal layer L1, and the first sub-layer M1, which may be the uppermost layer of the second metal layer L2. The third hole H3 overlaps with the second hole H2. In this case, the first sub-layer M1 of the first metal layer L1 and the first sub-layer M1 of the second metal layer L2 may contact each other.

In an embodiment, the third hole H3 may be formed by dry-etching the first sub-layer M1 including the material Ti. In this case, the third hole H3 may be formed to have a size or width (e.g., diameter) that approximately corresponds to that of the second hole H2. In the embodiment shown in FIG. 11C, the third hole H3 has a width (e.g., a diameter) that is slightly less than a width (e.g., a diameter) of the second hole H2, but the present disclosure is not limited thereto. For example, the width (or the diameter) of the third hole H3 may be the same as or substantially the same as (or similar to) the width (e.g., the diameter) of the second hole H2.

Figure 11D:
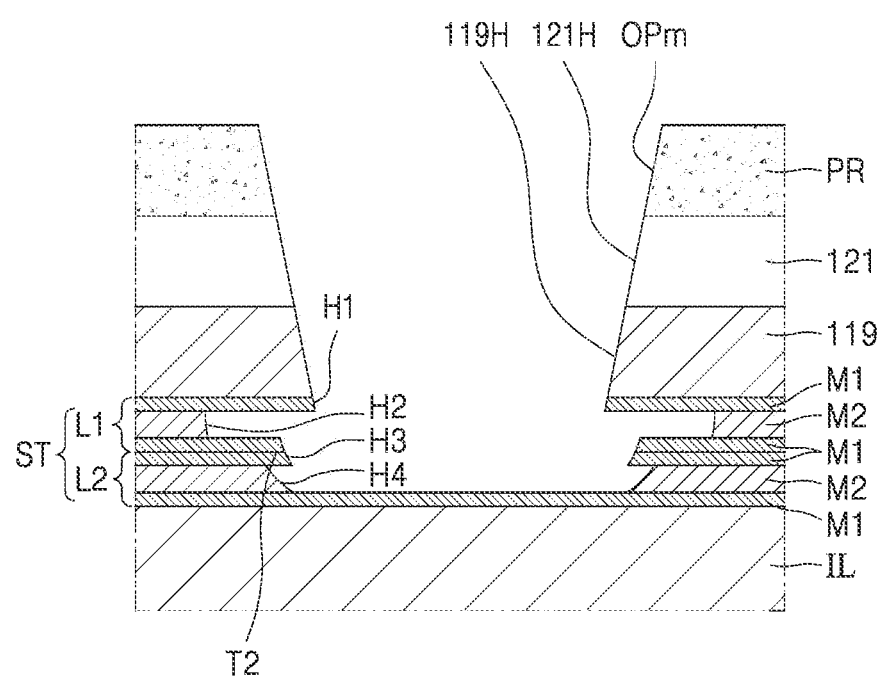

Next, as shown in FIG. 11D, a fourth hole H4 is formed in the second sub-layer M2 of the second metal layer L2. The fourth hole H4 may correspond to the third hole H3 formed in the previous operation (e.g., see FIG. 11C).

In more detail, because the second sub-layer M2 including the material Al is removed, wet etching may be used as in the operation shown in FIG. 11B. Because the wet etching is used, the fourth hole H4 may have a size that is greater than that of the third hole H3 formed by using dry etching. In some embodiments, during the wet etching process, the second sub-layer M2 of the first metal layer L1 that was previously wet-etched may be further etched. Therefore, in some embodiments, a size and/or a width (e.g., a diameter) of the second hole H2 that was already formed during the process of FIG. 11B may become larger.

Edges of the first sub-layer M1 of the lowermost layer of the first metal layer L1 and the first sub-layer M1 of the uppermost layer of the second metal layer L2 defining the third hole H3 may include the second tip T2 that extends (e.g., protrudes) further toward a center of the third hole H3 than an edge of the second sub-layer M2 of the first metal layer L1.

Figure 11E:
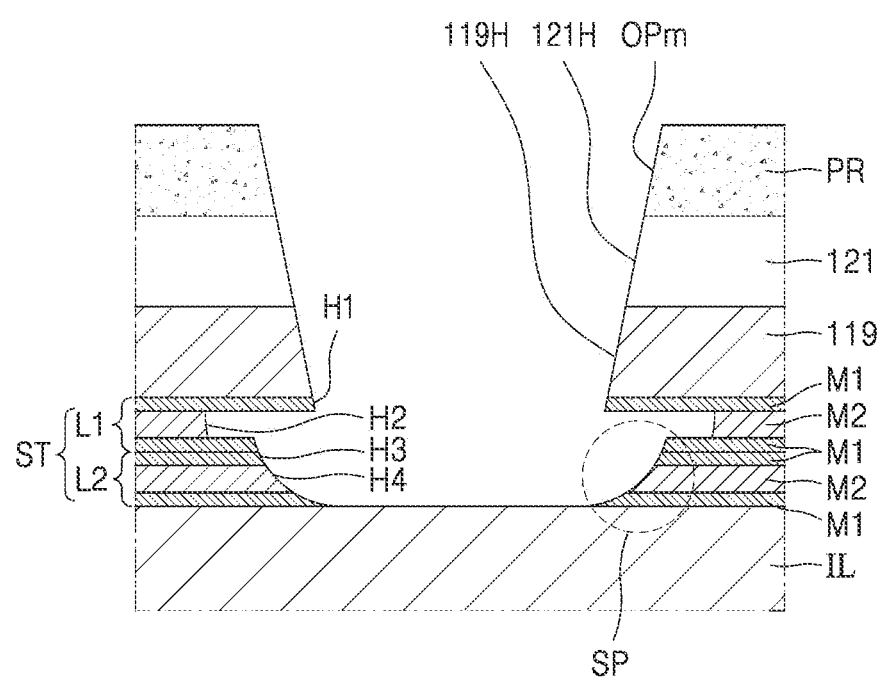

Next, as shown in FIG. 11E, a portion of the second tip T2 (e.g., see FIG. 11D) formed in the previous operation may be removed. A size and/or a width (e.g., a diameter) of the third hole H3 may become relatively larger than compared to that shown in FIG. 11D. In an embodiment, the width (e.g., the diameter) of the third hole H3 may be less than a width (e.g., a diameter) of the second hole H2, and a step difference may be formed between the corresponding sub-metal layers. The step difference may be formed at a location adjacent to (e.g., neighboring) a boundary surface between the first metal layer L1 and the second metal layer L2.

For example, because the first sub-layer M1 of the lowermost layer of the first metal layer L1 and the second metal layer L2 extend (e.g., protrude) further toward the center of the groove G than the second sub-layer M2 of the first metal layer L1, which is an intermediate layer of the first metal layer L1, the step difference SP may be formed on the inner surface of the groove G.

While FIG. 11E shows that the step difference SP is formed with a top surface of the first sub-layer M1 of the first metal layer L1 (e.g., which is the lowermost layer of the first metal layer L1) as the boundary, the boundary surface of the step difference SP may be variously modified depending on the number of layers removed during a time of an etching process, an amount of the protruding tip T (e.g., see FIG. 11D) that is removed, and/or the like.

Figure 11F:
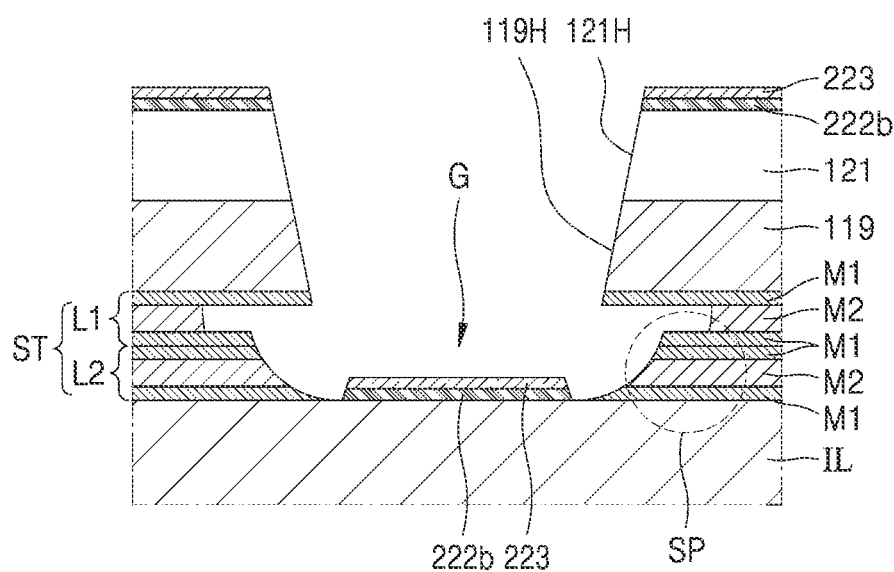

As shown in FIG. 11F, the photoresist layer PR may be removed. The intermediate layer and the opposite electrode 223 may be formed on the groove G, and at least one organic material layer (e.g., included in the intermediate layer) and the opposite electrode 223 may be separated or disconnected by the undercut structure and/or the eave structure of the tip T. For example, as shown in FIG. 11F, the functional layer 222b included in the intermediate layer and the opposite electrode 223 are separated or disconnected.

Figure 11G:
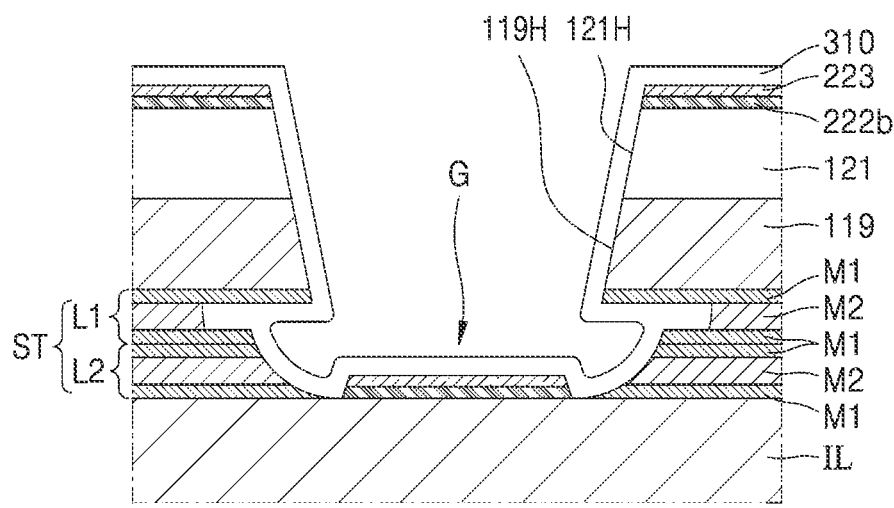

Next, as shown in FIG. 11G, the first inorganic encapsulation layer 310 is formed on the functional layer 222b and the opposite electrode 223 that are disconnected.

The first inorganic encapsulation layer 310 is not disconnected and may cover (e.g., entirely and continuously cover) a top surface of the opposite electrode 223 and the inner surface of the groove G. Therefore, the penetration of moisture and foreign substances into the organic light-emitting diode OLED in the display area DA (e.g., see FIG. 6A) may be effectively prevented or reduced as described above.

According to an embodiment, foreign substances such as moisture may be prevented or substantially prevented from penetrating into a lateral surface of an opening formed in a display device, which may cause damage to display elements surrounding (or adjacent to) the opening. However, the present disclosure is not limited to this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
a substrate including a top surface and a bottom surface opposite to the top surface, the substrate having an opening that passes from the top surface to the bottom surface;
a buffer layer on the top surface of the substrate;
a display element on the buffer layer and comprising a pixel electrode, an opposite electrode, and an intermediate layer between the pixel electrode and the opposite electrode, the display element being arranged in a display area;
an encapsulation layer on the display element and comprising a first inorganic encapsulation layer, a second inorganic encapsulation layer on the first inorganic encapsulation layer, and an organic encapsulation layer between the first inorganic encapsulation layer and the second inorganice encapsulation layer;
a first partition wall in a first non-display area between the display area and the opening of the substrate; and
a plurality of tips arranged in the first non-display area, wherein a metal stacked structure includes a first sub-metal layer and a second sub-metal layer under the first sub-metal layer, and wherein each of the plurality of tips corresponds to a portion of the first sub-metal layer that extends beyond a lateral surface of the second sub-metal layer,
wherein the plurality of tips comprises two adjacent tips arranged between the first partition wall and the opening of the substrate,
wherein at least one organic material layer of the intermediate layer or the opposite electrode is separated into a plurality of portions by the two adjacent tips, and
wherein the plurality of portions comprises:
a first portion and a second located on the two adjacent tips, respectively; and
a third portion between the two adjacent tips and located on the buffer layer, and
wherein a portion of the second inorganic encapsulation layer and a portion of the first inorganic encapsulation layer are in direct contact with each other and overlap with the third portion.

2. The display panel of claim 1, wherein a material of the first sub-metal layer is different from a material of the second sub-metal layer.

3. The display panel of claim 2, wherein the first sub-metal layer comprises titanium (Ti) and the second sub-metal layer comprises aluminum (Al).

4. The display panel of claim 1, wherein the at least one organic material layer of the intermediate layer comprises at least one of a hole transport layer, a hole injection layer, an electron transport layer, or an electron injection layer.

5. The display panel of claim 1, further comprising a second partition wall in the first non-display area, wherein the second partition wall is closer to the opening of the substrate than the first partition wall is.

6. The display panel of claim 5, wherein an edge of the organic encapsulation layer is closer to the display area than the second partition wall is.

7. The display panel of claim 1, wherein the plurality of tips comprises other two adjacent tips arranged between the first partition wall and the display area,
wherein the plurality of portions further comprises a fourth portion that is located between the other two adjacent tips, and a portion of the organic encapsulation layer overlaps with the fourth portion.

8. The display panel of claim 1, further comprising:
a plurality of data lines comprising a first data line and a second data line,
wherein a portion of the first data line and a portion of the second data line are located in a portion of the first non-display area between the first partition wall and the display area.

9. The display panel of claim 8, wherein the portion of the first data line in the first non-display area is above an insulation layer and the portion of the second data line in the first non-display area is below the insulation layer.

10. An electronic apparatus comprising:
a display panel including an opening area; and
a component under the display panel and corresponding to the opening area of the display panel,
wherein the display panel comprises:
a substrate including a top surface and a bottom surface opposite to the top surface, the substrate having an opening that passes from the top surface to the bottom surface;
a buffer layer on the top surface of the substrate;
a display element on the buffer layer and comprising a pixel electrode, an opposite electrode, and an intermediate layer between the pixel electrode and the opposite electrode, the display element being arranged in a display area;
an encapsulation layer on the display element and comprising a first inorganic encapsulation layer, a second inorganic encapsulation layer on the first inorganic encapsulation layer, and an organic encapsulation layer between the first inorganic encapsulation layer and the second inorganic encapsulation layer;
a first partition wall in a first non-display area between the display area and the opening of the substrate; and
a plurality of tips arranged in the first non-display area, wherein a metal stacked structure includes a first sub-metal layer and a second sub-metal layer under the first sub-metal layer, and wherein each of the plurality of tips corresponds to a portion of the first sub-metal layer that extends beyond a lateral surface of the second sub-metal layer, wherein the plurality of tips comprises two adjacent tips arranged between the first partition wall and the opening of the substrate, wherein at least one organic material layer of the intermediate layer or the opposite electrode is separated into a plurality of portions by two adjacent tips, and wherein one of the plurality of portions comprises:
a first portion and a second portion located on the two adjacent tips, respectively; and
a third portion between the two adjacent tips on the buffer layer, and wherein a portion of the second inorganic encapsulation layer and a portion of the first inorganic encapsulation layer are in direct contact with each other and overlap with the third portion.

11. The electronic apparatus of claim 10, wherein a material of the first sub-metal layer is different from a material of the second sub-metal layer.

12. The electronic apparatus of claim 11, wherein the first sub-metal layer comprises titanium (Ti) and the second sub-metal layer comprises aluminum (Al).

13. The electronic apparatus of claim 10, wherein the at least one organic material layer of the intermediate layer comprises at least one of a hole transport layer, a hole injection layer, an electron transport layer, or an electron injection layer.

14. The electronic apparatus of claim 10, wherein the display panel further comprises a second partition wall in the first non-display area, wherein the second partition wall is closer to the opening of the substrate than the first partition wall is.

15. The electronic apparatus of claim 14, wherein an edge of the organic encapsulation layer is closer to the display area than the second partition wall is.

16. The electronic apparatus of claim 10, wherein the plurality of tips comprises other two adjacent tips arranged between the first partition wall and the display area,
wherein the plurality of portions further comprises a fourth portion that is located between the other two adjacent tips, and a portion of the organic encapsulation layer overlaps with the fourth portion.

17. The electronic apparatus of claim 10, wherein the display panel further comprises:
a plurality of data lines comprising a first data line and a second data line,
wherein a portion of the first data line and a portion of the second data line are located in a portion of the first non-display area between the first partition wall and the display area.

18. The electronic apparatus of claim 17, wherein the portion of the first data line in the first non-display area is above an insulation layer and the portion of the second data line in the first non-display area is below the insulation layer.

19. The electronic apparatus of claim 10, wherein the component comprises a sensor or a camera.

* * * * *